US012694926B2

(12) United States Patent
Lu

(10) Patent No.: US 12,694,926 B2
(45) Date of Patent: Jul. 28, 2026

(54) CMOS SRAM STRUCTURE WITH BULK NMOS TRANSISTORS AND FULLY INSULATED PMOS TRANSISTORS IN ONE BULK WAFER

(71) Applicants:INVENTION AND COLLABORATION LABORATORY, INC., Taipei City (TW); ETRON TECHNOLOGY, INC., Hsinchu City (TW)

(72) Inventor: Chao-Chun Lu, Hsinchu (TW)

(73) Assignees: INVENTION AND COLLABORATION LABORATORY, INC., Taipei City (TW); ETRON TECHNOLOGY, INC., Hsinchu City (TW)

( * ) Notice: Subject to any disclaimer, the term of this patent is extended or adjusted under 35 U.S.C. 154(b) by 437 days.

(21) Appl. No.: 18/137,620

(22) Filed: Apr. 21, 2023

(65) Prior Publication Data

US 2024/0221827 A1     Jul. 4, 2024

Related U.S. Application Data

(60) Provisional application No. 63/436,106, filed on Dec. 30, 2022.

(51) Int. Cl.
*G11C 11/412*     (2006.01)
*H10B 10/00*     (2023.01)

(52) U.S. Cl.
CPC ............ *G11C 11/412* (2013.01); *H10B 10/12* (2023.02)

(58) Field of Classification Search
CPC .... G11C 11/412; H10B 10/12; H10B 10/125; Y10S 257/903; H10D 30/601; H10D 86/215; H10D 87/00
See application file for complete search history.

(56) References Cited

U.S. PATENT DOCUMENTS

2005/0073061 A1*   4/2005   Lee ......................... H10D 86/01
                                                         257/296
2010/0207213 A1*   8/2010   Tan ......................... H10D 86/01
                                                         438/151
2020/0343247 A1*   10/2020   Cheng .................. H10B 10/125

FOREIGN PATENT DOCUMENTS

KR      10-2005-0032970 A      4/2005

OTHER PUBLICATIONS

Korean Office Action for Korean Application No. 10-2023-0196125, dated Nov. 28, 2024, with English translation.

* cited by examiner

*Primary Examiner* — Eliseo Ramos Feliciano
*Assistant Examiner* — Sophia W Kao
(74) *Attorney, Agent, or Firm* — Birch, Stewart, Kolasch & Birch, LLP

(57)      ABSTRACT

A CMOS SRAM structure includes a Bulk semiconductor substrate with a PMOS active region and an NMOS active region. A set of PMOS transistors are formed in the PMOS active region and a set of NMOS transistors are formed in the NMOS active region. A VDD contacting line is electrically coupled to the set of PMOS transistors, a VSS contacting line is electrically coupled to the set of NMOS transistors, a word line is electrically coupled to the set of NMOS transistors, a bit line is electrically coupled to the set of NMOS transistors, and a complementary bit line is electrically coupled to the set of NMOS transistors. Wherein either the PMOS active region or the NMOS active region is a SOI region which is fully isolated from a rest portion of the Bulk semiconductor substrate which does not include the PMOS active region and the NMOS active region.

26 Claims, 24 Drawing Sheets

CMOS SRAM STRUCTURE WITH BULK NMOS TRANSISTORS AND FULLY INSULATED PMOS TRANSISTORS IN ONE BULK WAFER

CROSS REFERENCE TO RELATED APPLICATIONS

This application claims the benefit of U.S. provisional application Ser. No. 63/436,106, filed 2022 Dec. 30 entitled "CMOS SRAM Cell/Circuit Structure Optimized by Mixing Bulk NMOS Transistors and SOI PMOS Transistors in One Bulk Wafer", the whole content of which is incorporated herein.

BACKGROUND OF THE INVENTION

1. Field of the Disclosure

The present invention relates to a semiconductor device in a semiconductor Bulk substrate, and particularly to an optimized CMOS SRAM structure built in a semiconductor Bulk wafer by mixing bulk NMOS transistors and fully insulated PMOS transistors.

2. Description of the Related Art

For the state-of-the-art SOC (System-on-Chip) or processor chips, sometimes, more than 50% of the die area of a single chip is occupied by embedded SRAMs (called as eSRAM). For examples, a lot of CPU dice made by using a 28 nm CMOS technology node down to a 5 nm technology node, respectively, have such high percentage of their die areas which are occupied by eSRAM. So how to effectively reduce the eSRAM area on either entire CPU or SOC die is very critical for optimizing CMOS product design and technology to gain most efficiently optimized PPAC (Performance, Power, Area and Cost) results, which is critical to enable the Moore's Law's exponential economic growth of the semiconductor industry in the future.

One key improvement is focused on effectively shrinking the CMOS eSRAM cell area. But the current results are not very satisfied. Table 1 shows SRAM scaling results of one foundry at different process nodes, and FIG. 1 illustrates currently available SRAM scaling curves of three foundries versus different process nodes (see J. Chang et al., "15.1 A 5 nm 135 Mb SRAM in EUV and High-Mobility-Channel FinFET Technology with Metal Coupling and Charge-Sharing Write-Assist Circuitry Schemes for High-Density and Low-VMIN Applications," 2020 IEEE International Solid-State Circuits Conference—(ISSCC), 2020, pp. 238-240). Table 1 and FIG. 1 just articulate such a poor performance of scaling the cell areas versus different technology nodes in the past up to now. By assuming a FOM (Figure Of Merit) measuring the cell's efficiency could be defined as Cell Area/F^2, where Cell Area is the area of the SRAM cell, and F is the minimum feature size of the technology node is used and/or the process-node feature dimension as claimed by manufacturers. Using a technology in a CMOS process node of F=10 nm as an example, the FOM of 6T (Transistor) SRAM cell is around 420 F^2. However, when a CMOS eSRAM uses a process node F which is scaled down to 5 nm, the FOM is sharply increase to more than 800 F^2. That means, the efficiency of optimizing the usage of a CMOS is very ineffective. The more advanced technology is used for designing the state-of-the-art CMOS 6T SRAM cell, the higher percentage of die area is occupied by the eSRAM, thus causing the entire area of either CPU or SOC to be used not effectively for processing part but the same density of eSRAM occupies a not proportionally high percentage of the entire die area.

TABLE 1

| SRAM Cell Scaling Curve (28 nm~5 nm) and Calculated Results | | | | | | | | |
|---|---|---|---|---|---|---|---|---|
| Technology (nm) | 28 | 22 | 20 | 16 | 14 | 10 | 7 | 5 |
| SRAM cell area in μm² | 0.127 | 0.092 | 0.081 | 0.07 | 0.05 | 0.042 | 0.027 | 0.021 |
| SRAM cell area in P² | 174 | 190 | 203 | 273 | 255 | 420 | 551 | 840 |

For the conventional 6T CMOS SRAM structure shown in FIG. 2(a), the four NMOS transistors of the 6T CMOS SRAM which are configured as cross-couple diver devices, N1 and N2, and the other two NMOS transistors, N3 and N4, are used as access devices between the Bitline/Bitline-Bar and the two storage nodes. These four NMOS transistors are built into a P Well which is housed in the p-type Bulk semiconductor or silicon substrate which is connect to a Ground voltage (so this device structure and circuit configuration could be called as NMOS transistors in Bulk substrate, or Bulk NMOS technology), respectively. Furthermore, in the conventional SRAM structure, the two PMOS transistors of the CMOS SRAM cell, P1 and P2 (as shown in FIG. 2(a)) are commonly made in an N Well which is housed in the same Bulk substrate, and so they could be classified as PMOS transistors in the Bulk substrate.

As shown in FIG. 2(b) which shows an exemplary cross section view of an NMOS transistor 11 and a PMOS transistor 12 in the conventional 6T CMOS SRAM cell, the NMOS transistor 11 and the PMOS transistor 12 are located respectively inside some adjacent regions of P Well and N Well which have been formed next to each other within a close neighborhood, a parasitic junction structure called n+/p/n/p+ parasitic bipolar device is formed with its contour starting from the n+ region of the NMOS transistor 11 to the P Well to the neighboring N Well and further up to the p+ region of the PMOS transistor 12. There are significant noises occurred on either n+/p junctions or p+/n junctions, an extraordinarily large current may flow through this n+/p/n/p+ junction abnormally which can possibly shut down some operations of SRAM circuits and to cause malfunction of the entire chip. Such an abnormal phenomenon called latch-up is detrimental for SRAM operation and must be avoided. One way to increase the immunity to latch-up which is certainly a weakness for SRAM circuit is to increase the distance from n+ region to the p+ region. Thus, the increase of the distance from n+ region to the p+ region to avoid latch-up issue will also enlarge the size of the SRAM cell.

For CMOS SRAM cells, there are still lots of contacts, on one hand directly coupled to the PMOS and NMOS transistors, and on the other hand, coupled to the input terminal, the output terminal, high level voltage Vdd, and low level voltage Vss (or ground "GND"), etc. Especially, there are additional N Well contacts which are used to connect the N Well to the high level voltage Vdd, and additional P Well contacts which are used to connect the P Well to the low level voltage Vss.

By taking the most popular 6T CMOS SRAM cell as an example, the major difficulties are briefly summarized here:

(1) Table 2 shows the currently available Latch-Up Distances (LUD) reserved for separating NMOS and PMOS transistors located in a near distance without causing latch-up versus technology nodes. For examples, for F=10 nm, the LUD design requirement already uses 7.5 F, but for down to 5 nm, the LUD needs more than 10 F;

TABLE 2

SRAM Cell PMOS and NMOS Layout
Distance v.s. Process Nodes of Three Foundries

| Process Node (nm) | 22 | 16 | 14 | 10 | 7 | 5 |
|---|---|---|---|---|---|---|
| LUD (nm) | 101* | 96 | 89** | 75 | 56 | 54 |
| LUD (F) | | 4.5 | 6 | 6.35 | 7.5 | 8 | 10.8 |

Data of 16/10/7/5 nm from Foundry A
*Data of 22 nm from Foundry B
**Data of 14 nm from Foundry C (2) Even by miniaturization of the manufacture process feature down to the 28 nm or lower, due to the interference among the size of the contacts, among layouts of the metal wires connecting the word-line (WL), bit-lines (BL and BL Bar), high level voltage VDD, and low level voltage VSS, etc., the total area of the SRAM cell represented by $F^2$ dramatically increases when the minimum feature size decreases, as shown in FIG. 1.

Therefore, how to redesign the SRAM cell such that the total area of the SRAM cell represented by $F^2$ could maintain within an acceptable range when the minimum feature size decreases is a challenge. Thus, there is a need to propose a new standard cell structure which could solve the above-mentioned problem.

SUMMARY OF THE DISCLOSURE

The present invention could be described in the following. The four NMOS transistors N1~N4 of the CMOS SRAM cell (as shown in FIG. 2(a)) could be still built into the p-type Bulk semiconductor or silicon substrate as usually. On the other hand, the two PMOS P1 and P2 transistors of the CMOS SRAM cell, as shown in FIG. 2(a), are disposed into a SOI (Silicon On Insulator) structure selectively (or localized) formed in the same Bulk semiconductor or silicon substrate.

That is, LSOI (Localized Silicon On Insulator) islands or SUIL (Selectively Underground Insulating Layers) are selectively formed in portions of the Bulk semiconductor substrate without a need of buying an entire SOI Wafer or SOI substrate (such SOI substrate has an insulator extending all over the substrate or wafer) which is very expensive, and PMOS transistors of the SRAM cell could be formed in the LSOI or above the SUIL. So between NMOS and PMOS transistors there is no need to reserve extra LUD (Latch-Up Distance) for achieving a CMOS configuration. There is no path for current flow to cause awkward latch-up phenomena. As a result the CMOS SRAM cell size can be made more compactly and the more simplified circuit layout can be accomplished with much less area. Thus, the difficulties of making a compact 6T CMOS SRAM cell, circuit and layout design with better PPAC can be improved.

One embodiment of the present disclosure is to provide a CMOS SRAM cell structure, the proposed CMOS SRAM cell structure comprises a Bulk semiconductor substrate with a PMOS region body and an NMOS region body, wherein a set of PMOS transistors are disposed in the PMOS region body and a set of NMOS transistors are disposed in the NMOS region body. A VDD contacting line is electrically coupled to the set of PMOS transistors, a VSS contacting line is electrically coupled to the set of NMOS transistors, a word line is electrically coupled to the set of NMOS transistors, a bit line is electrically coupled to the set of NMOS transistors, and a complementary bit line is electrically coupled to the set of NMOS transistors. Wherein either the PMOS region body or the NMOS region body is a localized semiconductor on insulator (SOI) region which is fully isolated from a rest portion of the Bulk semiconductor substrate excluding the PMOS region body and the NMOS region body.

According to one aspect of the present disclosure, the localized SOI region is fully isolated from the rest portion of the Bulk semiconductor substrate by an insulating layer and a shallow trench isolation (STI) region surrounding the localized SOI region, wherein the insulating layer is under the original semiconductor surface of the Bulk semiconductor substrate.

According to one aspect of the present disclosure, wherein a bottom of the STI region is lower than that of the insulating layer.

According to one aspect of the present disclosure, wherein the shallow trench isolation (STI) region surrounds the insulating layer.

According to one aspect of the present disclosure, wherein the PMOS region body is the localized SOI region, the insulating layer is positioned under the set of PMOS transistors, and the set of PMOS transistors are fully isolated from the rest portion of the Bulk semiconductor substrate.

According to one aspect of the present disclosure, wherein the insulating layer is an oxide layer extending from one sidewall to another opposite sidewall of the PMOS region body.

According to one aspect of the present disclosure, one NMOS transistor comprises a channel region, a gate region above the channel region, a source region electrically contacting to the channel region, a metal region, and a L-shape oxide layer under a bottom of the source region. Wherein the source region includes a selectively grown LDD region and a selectively grown heavily doped region laterally extending from the selectively grown LDD region, and the metal region contacts a top surface and a sidewall of the source region.

Another embodiment of the present disclosure is to provide a CMOS SRAM cell structure, the CMOS SRAM cell structure comprises a Bulk semiconductor substrate with an original semiconductor surface and the Bulk semiconductor substrate comprises a first PMOS region body, a second PMOS region body, and an NMOS region body. A first PMOS transistor is disposed in the first PMOS region body, and a second PMOS transistor is disposed in the second PMOS region body, wherein the first PMOS region body is physically separate from the second PMOS region body. A set of NMOS transistors disposed in the NMOS region body and are electrically connected to the first and the second PMOS transistors. A VDD contacting line is electrically coupled to the first and the second PMOS transistors, a VSS contacting line is electrically coupled to the set of NMOS transistors, a word line is electrically coupled to the set of NMOS transistors, a bit line is electrically coupled to the set of NMOS transistors, and a complementary bit line is electrically coupled to the set of NMOS transistors. Wherein both the first PMOS region body and the second PMOS region body are fully isolated from a rest portion of the Bulk semiconductor substrate excluding the first PMOS region body, the second PMOS region body, and the NMOS region body.

According to one exemplary aspect of the present disclosure, wherein the first PMOS region body is fully isolated from the rest portion of the Bulk semiconductor substrate by a first insulating layer and a first shallow trench isolation (STI) region surrounding the first PMOS region body, wherein the first insulating layer is under the original semiconductor surface of the Bulk semiconductor substrate.

According to one aspect of the present disclosure, wherein the second PMOS region body is fully isolated from the rest portion of the Bulk semiconductor substrate by a second insulating layer and a second shallow trench isolation (STI) region surrounding the second PMOS region body, wherein the second insulating layer is under the original semiconductor surface of the Bulk semiconductor substrate; wherein the second insulating layer is physically separate from the first insulating layer.

According to one aspect of the present disclosure, wherein each of the first PMOS transistor and the second PMOS transistor is a fin-shape transistor.

According to one aspect of the present disclosure, wherein an area of the first PMOS transistor is the same or substantially the same as that of the first PMOS region body, and an area of the second PMOS transistor is the same or substantially the same as that of the second PMOS region body.

According to one aspect of the present disclosure, wherein the NMOS region body is electrically coupled to the rest portion of the bulk semiconductor substrate.

According to one aspect of the present disclosure, wherein the CMOS SRAM structure is a 6T SRAM structure including the first PMOS transistor, the second PMOS transistor, and the set of NMOS transistors which comprises four NMOS transistors.

Yet another embodiment of the present disclosure provides a CMOS SRAM cell structure, the CMOS SRAM structure comprises a Bulk semiconductor substrate with an original semiconductor surface, and a plurality of transistors formed based on the Bulk semiconductor substrate, wherein the plurality of transistors includes a set of first type transistors and a set of second type transistors, and the set of first type transistors are electrically coupled to the set of second type transistors. A plurality of conductive contacts are coupled to the plurality of transistors, wherein one first type transistor is formed based on a first semiconductor region of the Bulk semiconductor substrate, and one second type transistor is formed based on a second semiconductor region of the Bulk semiconductor substrate; wherein the first semiconductor region is fully isolated from a rest portion of the Bulk semiconductor substrate not including the first semiconductor region and the second semiconductor region, and the second semiconductor region is electrically connected to the rest portion of the Bulk semiconductor substrate.

According to one aspect of the present disclosure, wherein the CMOS SRAM structure further comprises an underground insulating layer under the original semiconductor surface of the Bulk semiconductor substrate and formed under the one first type transistor, and a shallow trench isolation region surrounding the one first type transistor; wherein the one first type transistor is fully isolated from the rest portion of the Bulk semiconductor substrate by the underground insulating layer and the shallow trench isolation region.

According to one aspect of the present disclosure, wherein the shallow trench isolation region surrounds the underground insulating layer.

According to one aspect of the present disclosure, wherein the one first type transistor is a PMOS transistor, and the one second type transistor is an NMOS transistor, and the Bulk semiconductor substrate is a Bulk silicon substrate.

According to one aspect of the present disclosure, wherein the underground insulating layer comprises oxide.

According to one aspect of the present disclosure, wherein the first semiconductor region is a PMOS region body, an area of the one first type transistor is less than that of the PMOS region body.

According to one aspect of the present disclosure, wherein the first semiconductor region is a PMOS region body, an area of the one first type transistor is the same or substantially the same as that of the PMOS region body.

Yet another embodiment of the present disclosure provides a CMOS SRAM circuit, wherein CMOS SRAM circuit includes a Bulk semiconductor substrate with a PMOS region body and an NMOS region body, a set of PMOS transistors formed in the PMOS region body, and a set of NMOS transistors formed in the NMOS region body; wherein the bulk semiconductor substrate is not a SOI substrate, wherein either the PMOS region body or the NMOS region body is not encompassed by a well region in the Bulk semiconductor substrate.

According to one aspect of the present disclosure, wherein the well region is an N well region, and the PMOS region body is not encompassed by the N well region in the Bulk semiconductor substrate.

According to one aspect of the present disclosure, wherein the well region is a P Well region, and the NMOS region body is not encompassed by the P Well region in the Bulk semiconductor substrate.

According to one aspect of the present disclosure, wherein there is only one STI region between a P+ region of one PMOS transistor of the set of PMOS transistors and a N+ region of one NMOS transistor of the set of NMOS transistors, wherein a lateral width of the one STI region is a minimum STI distance.

According to one aspect of the present disclosure, wherein the minimum STI distance is not greater than 3 F, wherein F is the minimum feature size or a process-node feature dimension.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

The present invention discloses a new CMOS SRAM cell with bulk NMOS transistors and fully insulated PMOS transistors in the same Bulk semiconductor substrate or wafer to eliminate the latch-up issue. Detailed steps of manufacturing the new CMOS SRAM structure are as follows:

Step 10: prepare a P-type Bulk substrate or wafer.

Step 20: Based on the P-type Bulk substrate wafer 30, form P active regions and NMOS active regions.

Step 30: Form underground insulating layers in the PMOS active regions.

Step 40: Form PMOS transistors in the PMOS active regions and form NMOS transistors in the NMOS active regions, respectively.

Step 50: Based on the PMOS transistors in the PMOS active regions and the NMOS transistors in the NMOS active regions, form metal connections to finalize the CMOS SRAM structure.

Figure 3:
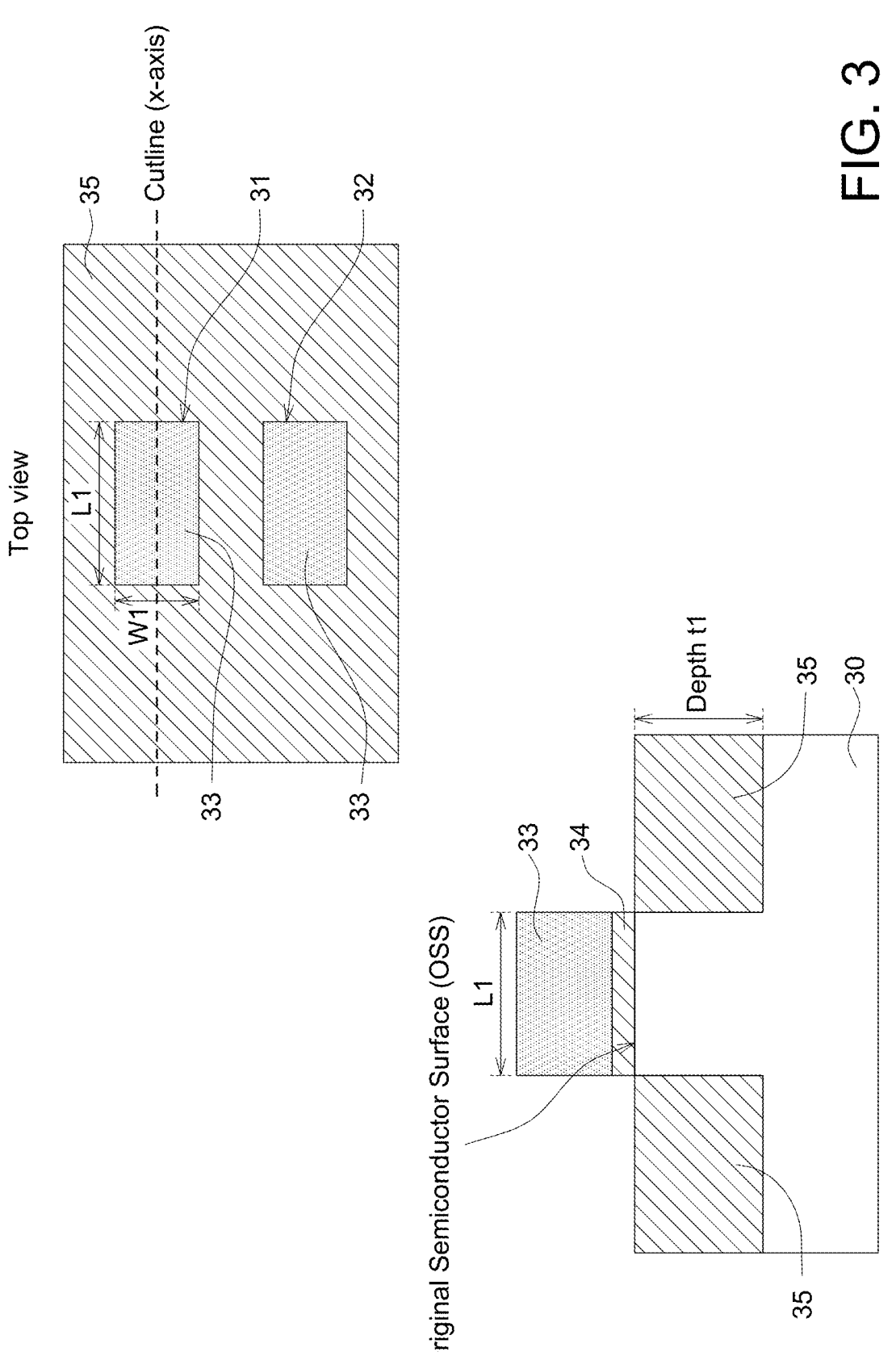
FIG. 3 is a diagram illustrating the process to define the active regions.
Figure 4:
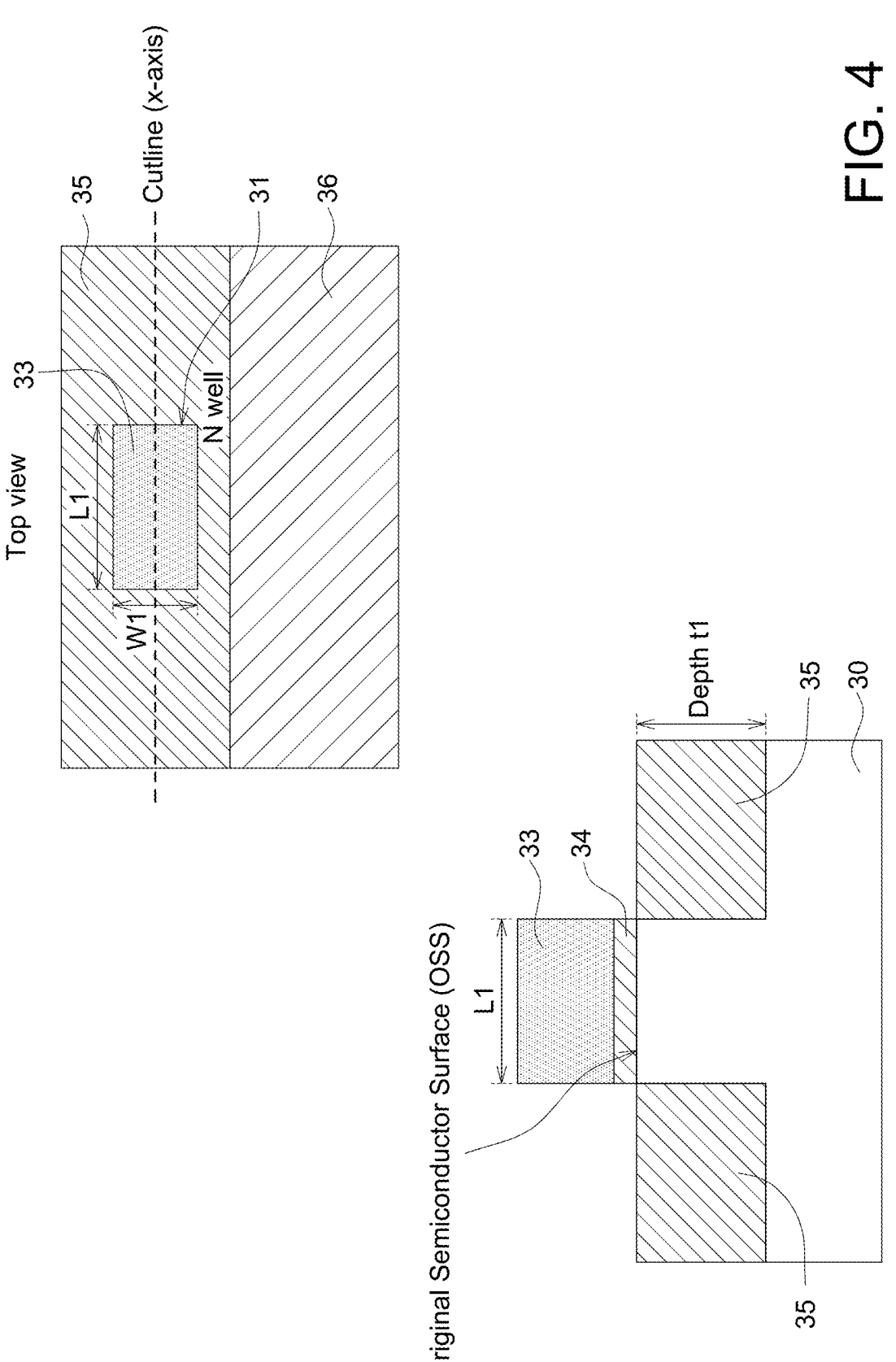
FIG. 4 is a diagram illustrating the process to reveal the PMOS active region but not to reveal the NMOS active region.

Please refer to FIG. 3, Step 20 could include:

Step 202: Grow a pad-oxide layer 34 over the P-type Bulk substrate 30 and deposit a pad-nitride layer 33 over the pad-oxide layer 34.

Step 204: Define PMOS active regions 31 and NMOS active regions 32 by photolithographic mask, and remove parts of a semiconductor material (such as silicon) corresponding to the OSS (Original Semiconductor Surface) or OHS (Original Horizontal Surface) of the P-type Bulk substrate outside the PMOS active regions 31 and NMOS active regions 32.

Step 206: Deposit dielectric material, such as oxide, to form STI (Shallow Trench Isolation) 35 surrounding the PMOS active regions 31 and the NMOS active regions 32.

Please refer to FIGS. 4~7, Step 30 could include:

Step 302: Form a covering layer 36 (such as oxide) and use photolithographic mask to reveal the STI 35 surrounding the PMOS active regions 31, wherein NMOS active regions 32 are protected by the covering layer 36.

Step 304: Etch down the STI 35 surrounding the PMOS active regions 31 to reveal a first portion of edges of the PMOS active regions 31, and form spacers (such as oxide spacer 51 and nitride spacer 52) to cover the first portion of edges of the PMOS active regions 31.

Step 306: Further etch down the STI region 35 surrounding the PMOS active regions 31 to reveal a second portion of edges of the PMOS active regions 31.

Step 308: Based on the second portion of edges of the PMOS active region 31, form SUIL (Selectively Underground Insulating Layer) 53 in the PMOS active region 31, wherein LSOI (Localized Silicon On Insulator) island or PMOS region body 54 is above the SUIL (Selectively Underground Insulating Layer).

Step 310: Remove the covering layer 36 over the NMOS active regions 32, then deposit and etch back dielectric material 37 (such as spin-on-dielectric or oxide) all over the P-type Bulk substrate 30.

Please refer to FIGS. 8 (a)~ 8(d), Step 40 could include:

Step 402: From gate structures in the PMOS active regions 31.

Step 404: From trenches 80 in the PMOS active regions 31 by removing parts of semiconductor material outside the gate structures in the PMOS active regions 31.

Step 406: Form a buried isolating layer in the trenches 80, and etch portion of the buried isolating layer to reveal edges of semiconductor material in the PMOS active regions 31.

Step 408: Based on the revealed edges of semiconductor material in the PMOS active regions 31, form doped source/drain regions in the PMOS active regions 31 to complete the PMOS transistors.

Step 410: Bases on the similar steps 402~408, form the NMOS transistors in the NMOS active regions 32.

Please refer to Steps 202~206 and FIG. 3, to form the PMOS active regions and NMOS active regions, a typical Bulk semiconductor wafer (either p-type or n-type) as the entire substrate for construction of integrated circuits in multiple dice on this wafer is first prepared wherein the doping concentration thereof could be around $10^{16}$. Then grow a pad-oxide layer 34 over the P-type Bulk substrate 30 and deposit a pad-nitride layer 33 over the pad-oxide layer 34. Thereafter, adopt the well-known photolithographic processes to define the PMOS active regions 31 and the NMOS active regions 32, and remove the pad-nitride layer 33, the pad-oxide layer 34, and the semiconductor material corresponding to the OSS (Original Semiconductor Surface) or OHS (Original Horizontal Surface) of the P-type Bulk substrate 30 outside the defined PMOS active regions 31 and NMOS active regions 32, such that the rectangular PMOS active region 31 and NMOS active region 32 covered by the remaining pad-oxide layer 34 and then the pad-nitride layer 33 (Length L1×Width W1) over the OSS. Outside these active regions, use the well-known techniques to form STI regions 35 with the depth of t1 (as shown in FIG. 3) surrounding these PMOS active region 31 and NMOS active region 32. In another example, the top surface of the STI regions 35 can be leveled up to the top surface of the pad-nitride 33.

The following describes the steps to form underground insulating layers in the PMOS active regions. Please refer to Step 302 and FIG. 4, deposit a covering layer 36 (such as oxide layer) all over P-type Bulk substrate 30, and use photo-resistance patterning to remove the covering layer 36 over the PMOS active region 31, such that the STI region 35 surrounding the PMOS active region 31 is revealed, wherein the NMOS active regions 32 are still protected by the covering layer 36.

Figure 5A:
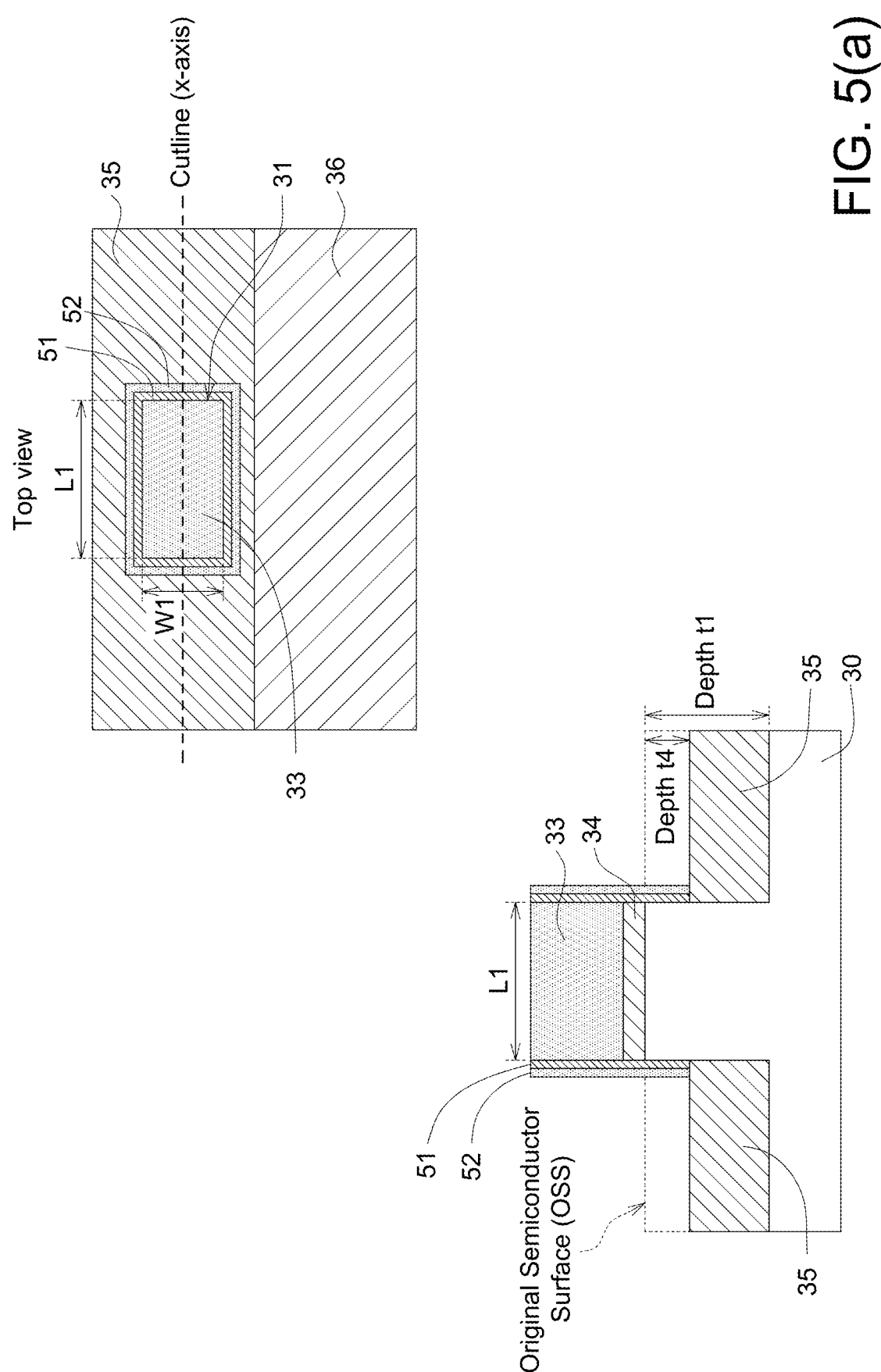
FIGS. 5(a)~5(b) are diagrams illustrating the processes to reveal the vertical edges of the PMOS active region.
Figure 5B:
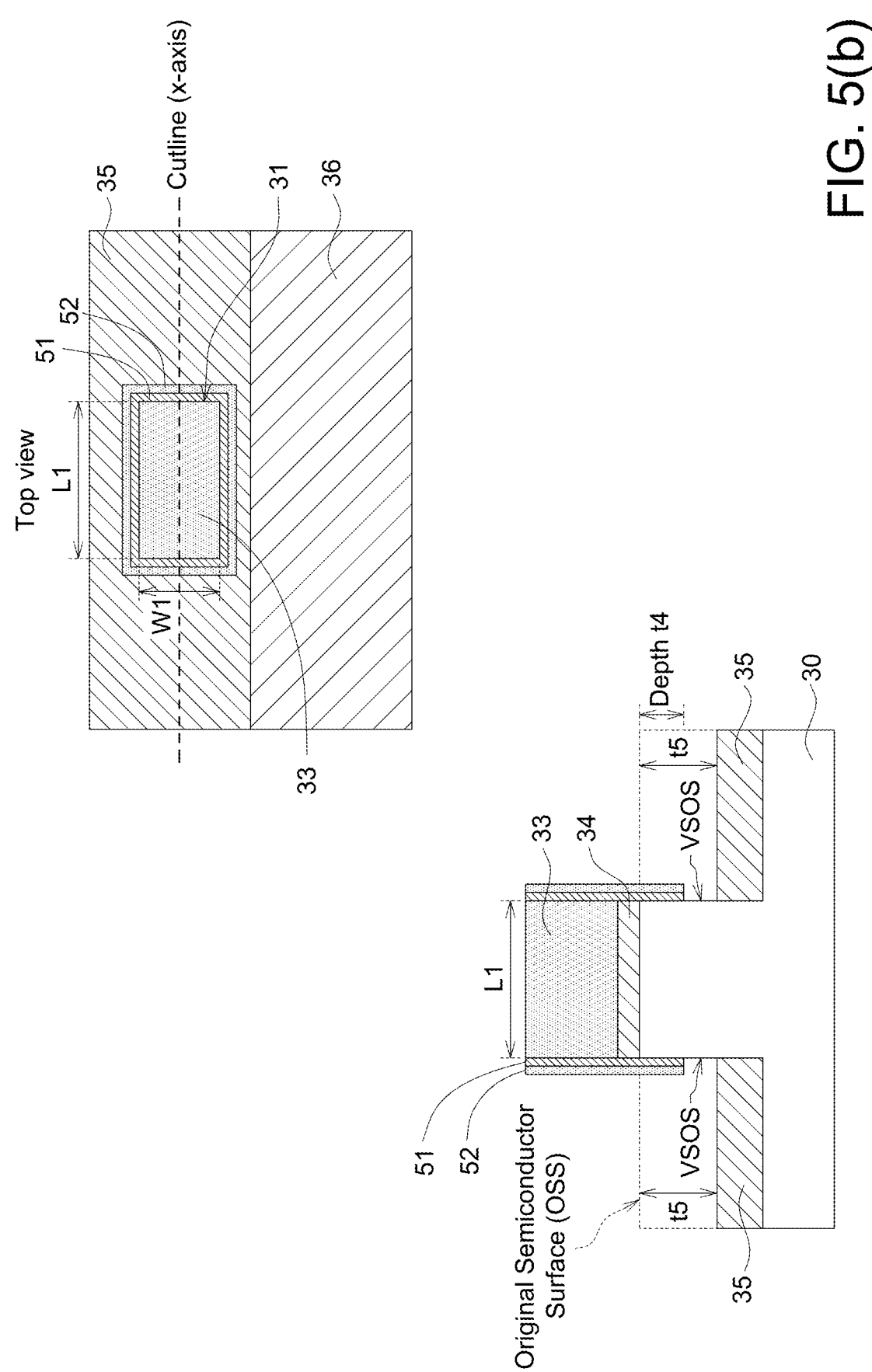

Then, refer to Step 304 and FIG. 5 (a), etch down the STI region 35 surrounding the PMOS active region 31 about a thickness of t4 to reveal sidewalls of the P-type Bulk substrate 30, and form oxide spacer 51 and nitride spacer 52 to cover the sidewalls of the pad-oxide layer 34, the pad-nitride 33 and the revealed sidewalls of the P-type Bulk substrate 30.

Afterward, refer to Step 306 and FIG. 5 (b), further etch down the STI region 35 surrounding the PMOS active regions 31 such that the distance between the top of the rest STI region 35 and the Original Silicon Surface (OSS) is around t5. Thus, vertical silicon sidewalls with a depth of (t5-t4), called as VSOS (Vertical Silicon Oxidation Seed), is well exposed as the seed of the subsequent oxidation process.

Figure 6A:
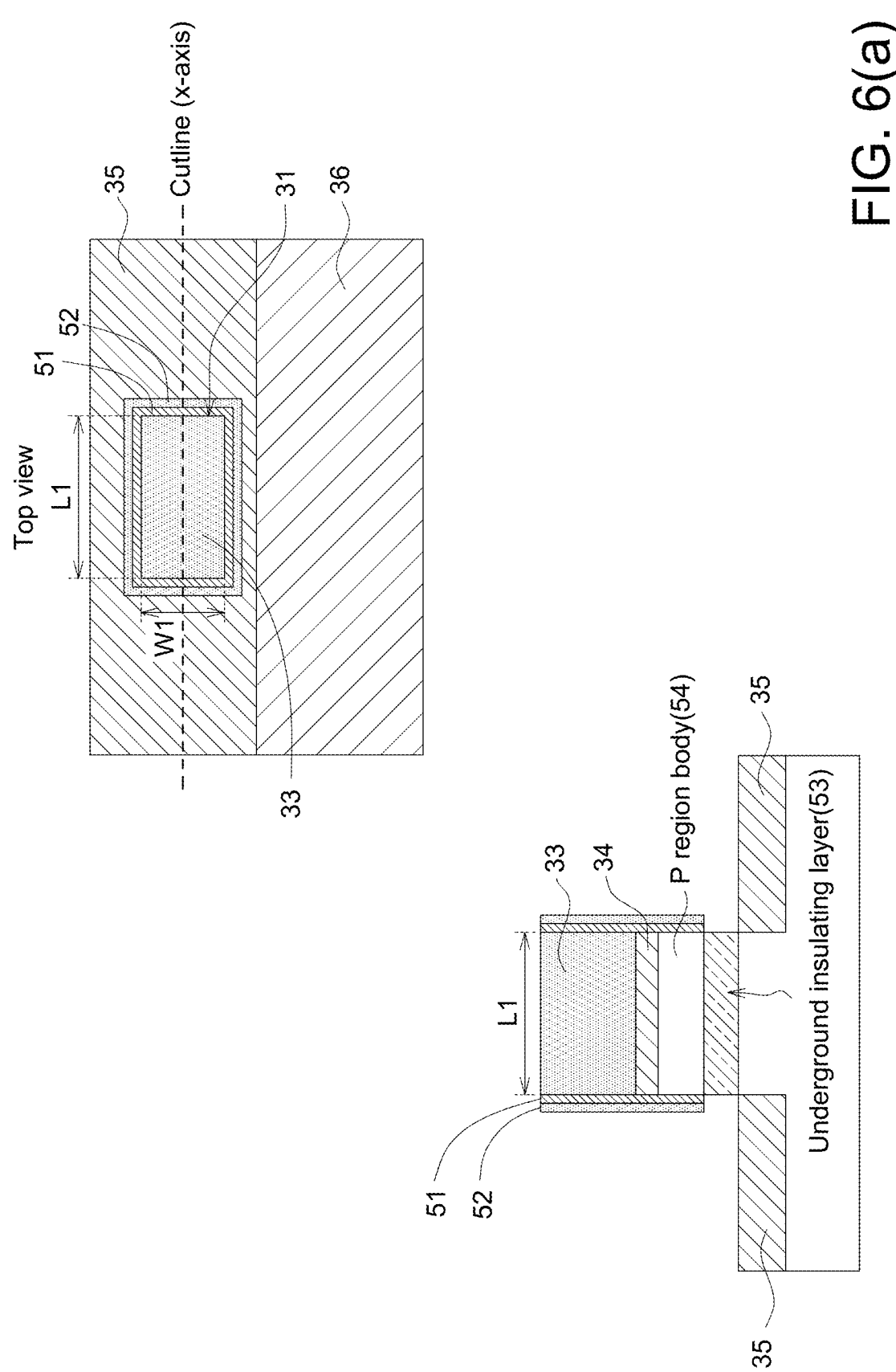
FIG. 6(a) a diagram illustrating the process to form Selectively Underground Insulating Layer in the PMOS active region.
Figure 6B:
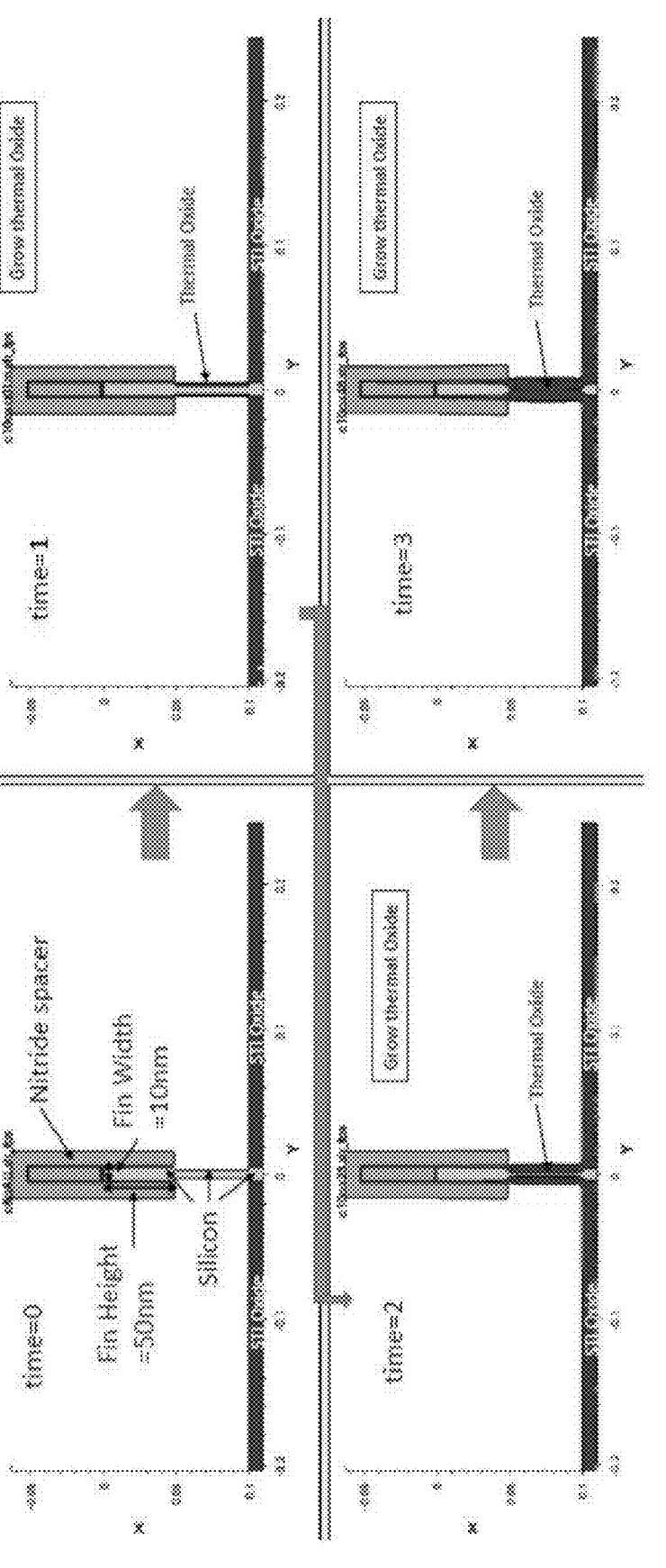
FIG. 6(b) shows the simulation result to form the Selectively Underground Insulating Layer based on the PMOS active region structure which is similar to FIG. 6(a).

Then, refer to Step 308 and FIGS. 6(a)~6(b), an oxidation process is conducted thermally with special designs based on those vertical silicon sidewalls VSOS. A thermally grown $SiO_2$ layer is formed from the exposed vertical silicon sidewalls VSOS until their respective forefront edges are touched, as shown in FIG. 6(a). Therefore, a Selectively Underground Insulating Layer (SUIL) 53 or Selectively Localized Insulating Layer (SLIL) is built up underneath the PMOS active regions 31, and a desired LSOI (Localized Silicon On Insulator) structure is made without a need of using expensive, entire SOI wafers as most popularly used today. This LSOI structure includes the PMOS region body 54 (or PMOS semiconductor body) which can be well used as a "substrate" to house PMOS transistors or other devices, wherein the PMOS region body is usually doped with N type dopants. FIG. 6(b) shows the simulation result, based on TCAD simulation by Sentaurus, to form the SUIL (majorly made of $SiO_2$) based on the PMOS active region structure which is similar to FIG. 6(a), wherein the PMOS active region 31 is a fin structure, the fin height is 50 nm, and the fin width is 10 nm. At the thermal oxidation temperature is 700° C., it is found that the bottom of the fin structure is fully covered by the thermally formed oxide layer, or the Selectively Underground Insulating Layer (SUIL) 53.

Figure 6C:
FIG. 6(c) shows the simulation result regarding the repeated oxidation/etching process against the structure corresponding to one side of the PMOS active region in FIG. 5(b)
Figure 6D:
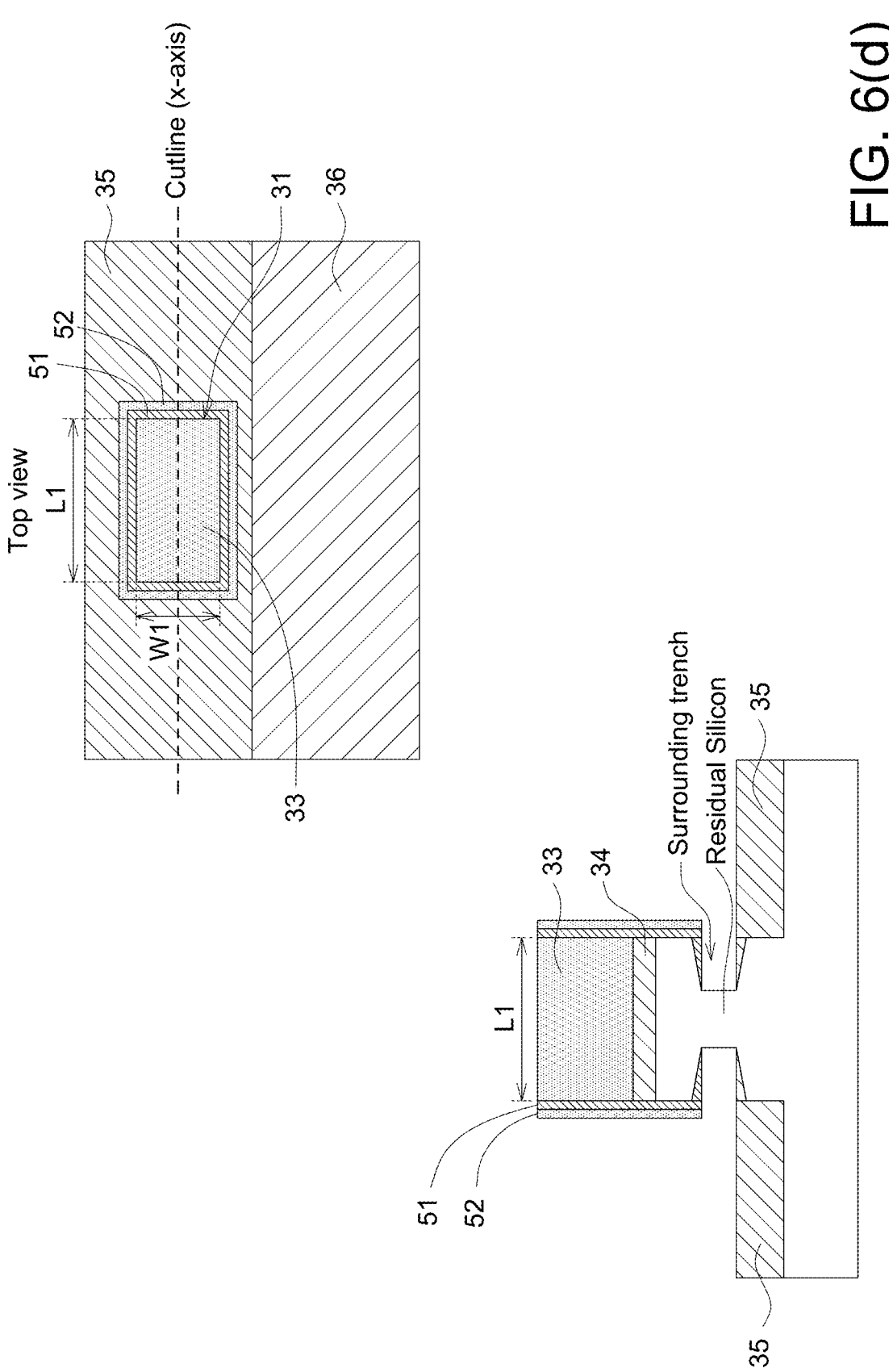
FIG. 6(d) is a diagram illustrating the PMOS active region with residual silicon after the completion of the repeated oxidation/etching process.
Figure 6E:
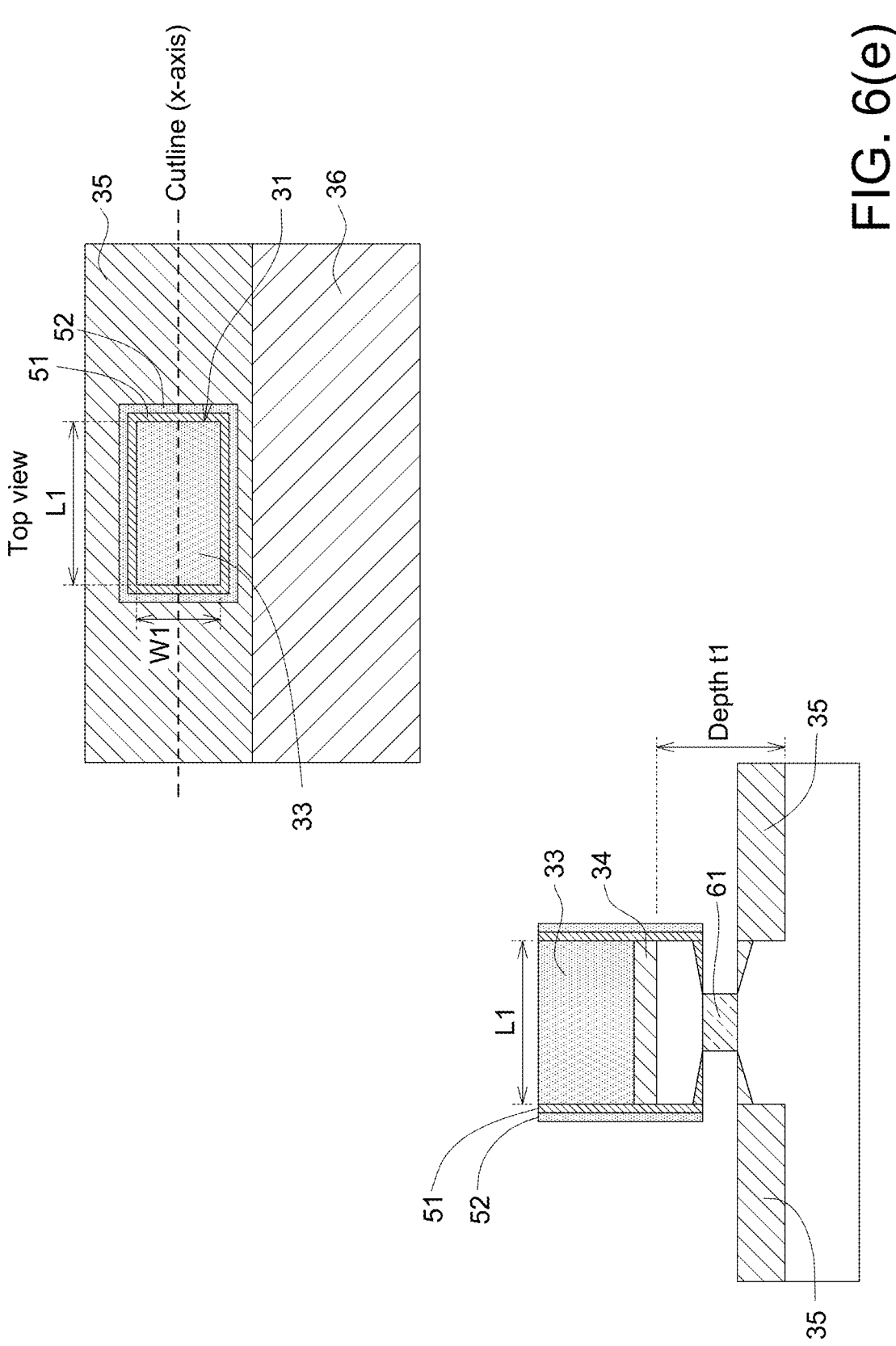
FIG. 6(e) is a diagram illustrating the thermal oxidation for the residual silicon described in FIG. 6(d)
Figure 6F:
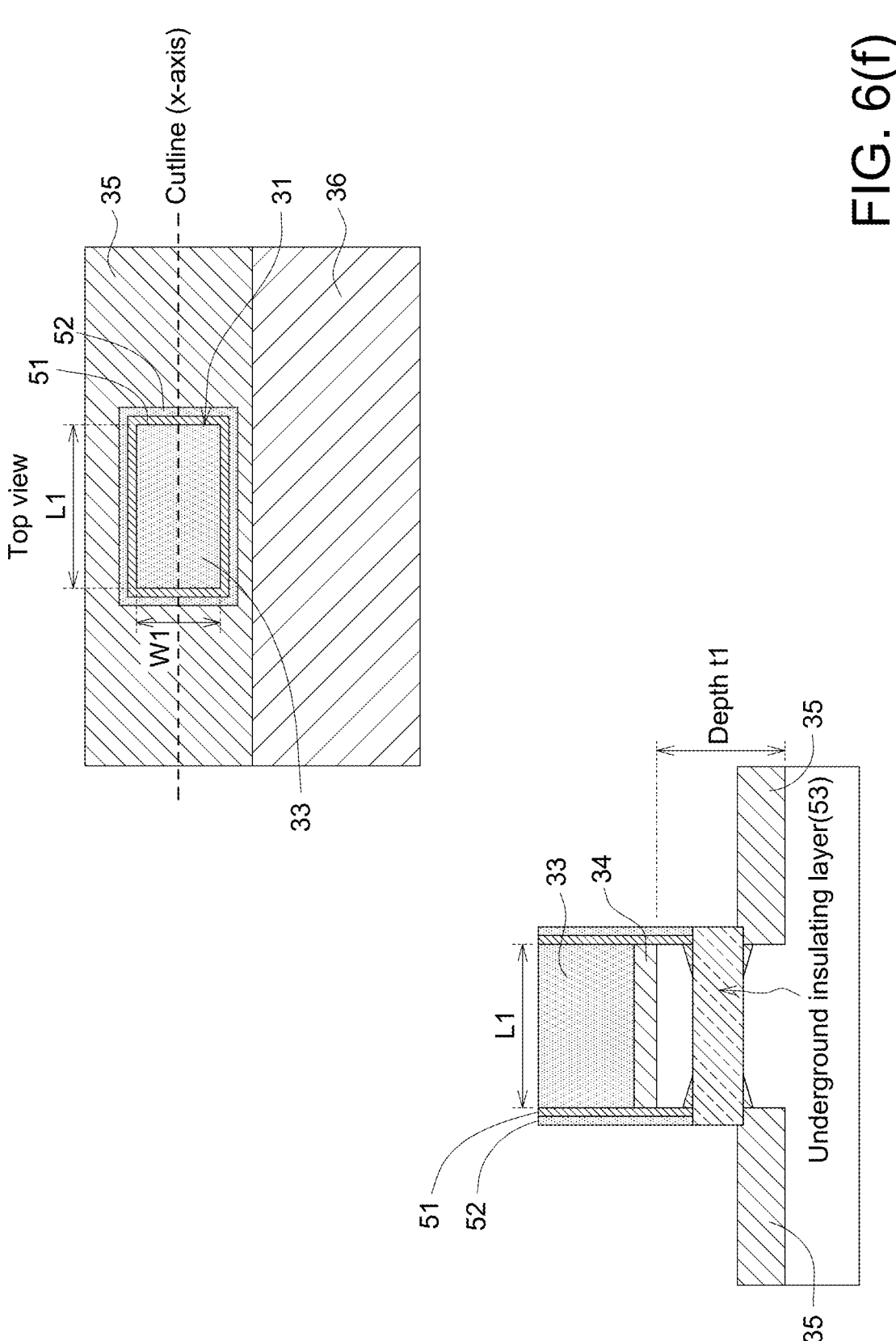
FIG. 6(f) is a diagram illustrating the process to form Selectively Underground Insulating Layer in the PMOS active region based on FIG. 6(e).

Alternatively, another way to form the Selectively Underground Insulating Layer (SUIL) could be described as follows. Based on the those vertical silicon sidewalls VSOS shown in FIG. 5(b), a repeated oxidation/etching process is conducted with special designs over those vertical silicon sidewalls VSOS to remove most of the silicon material between those vertical silicon sidewalls VSOS. As shown in FIG. 6(c) which simulates, based on TCAD simulation by Sentaurus, the repeated oxidation/etching process against the structure corresponding to one side of the PMOS active region in FIG. 5(b), at time=0, a thin thermal oxide is grown on the vertical Silicon sidewall of the VSOS at 800° C., and at time=1, the previously grown thermal oxide is etched to reveal the silicon surface. Again, at time=2, a thin thermal oxide is then grown on the revealed silicon sidewall at 800° C., and at time=3, the previously grown thermal oxide at time=2 is etched to reveal the silicon surface again. Such oxidation/etching process is repeated (at time=4~time=9) until most of the silicon material between those vertical silicon sidewalls VSOS is removed and only residual silicon is left as shown in FIG. 6(d). Therefore, a horizontal cavity or a surrounding trench is formed and surrounds the residual silicon. Thereafter, a thermal oxidation is performed such that all residual silicon is turned into thermal oxide (hereinafter, the neck thermal oxide), as shown in FIG. 6(e). Once the horizontal cavity or the surrounding trench is created by using this continuous oxide growing—and etching technique, the CVD (Chemical Vapor Deposition) technique is used to deposit and etch back oxide film to completely fill the horizontal cavity or the surrounding trench, as shown in FIG. 6(f). Therefore, the Selectively Underground Insulating Layer (SUIL) 53 is finalized.

Figure 7A:
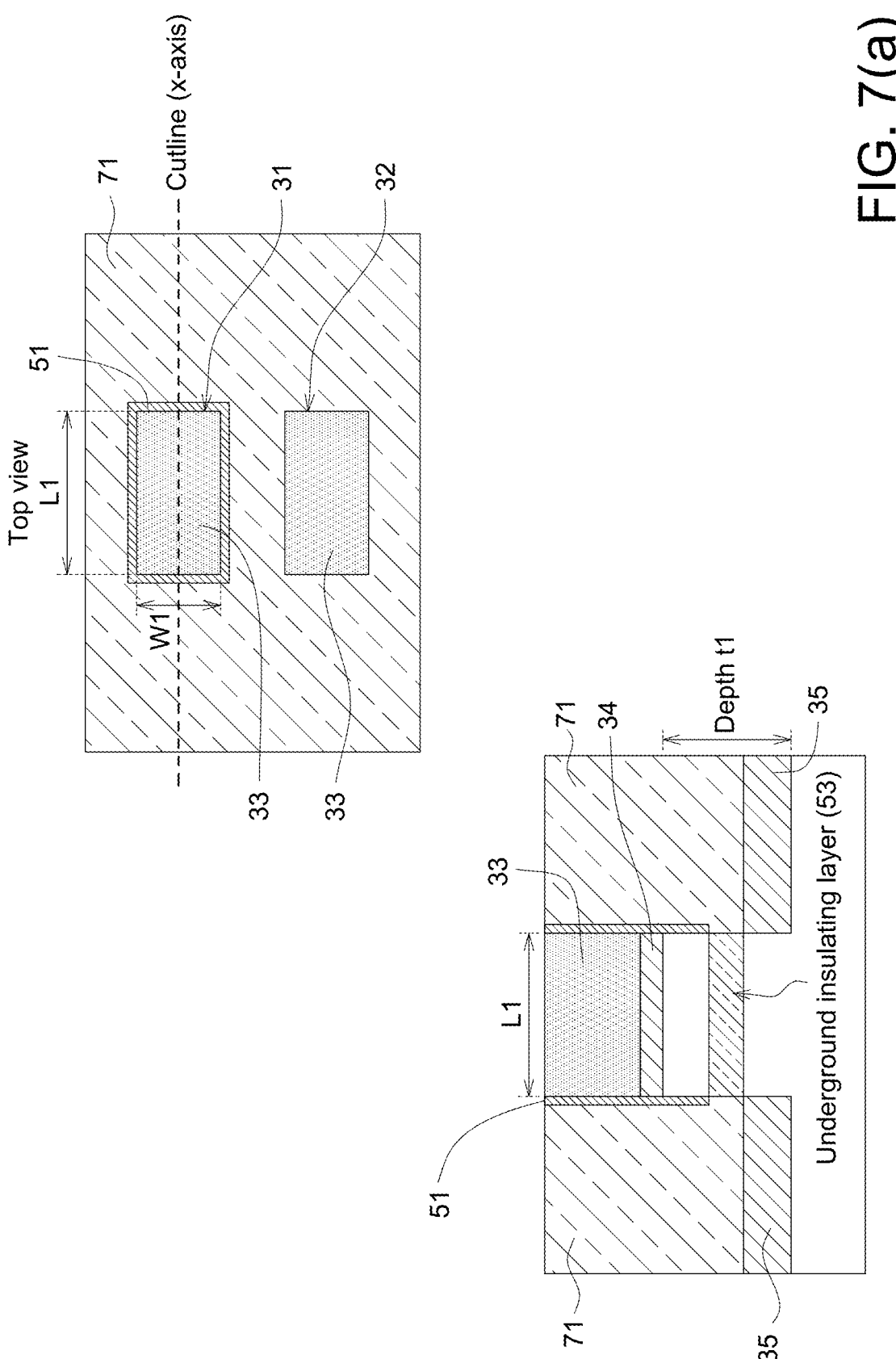
FIG. 7(a) is a diagram showing the PMOS active region with the Underground Insulating Layer.
Figure 7B:
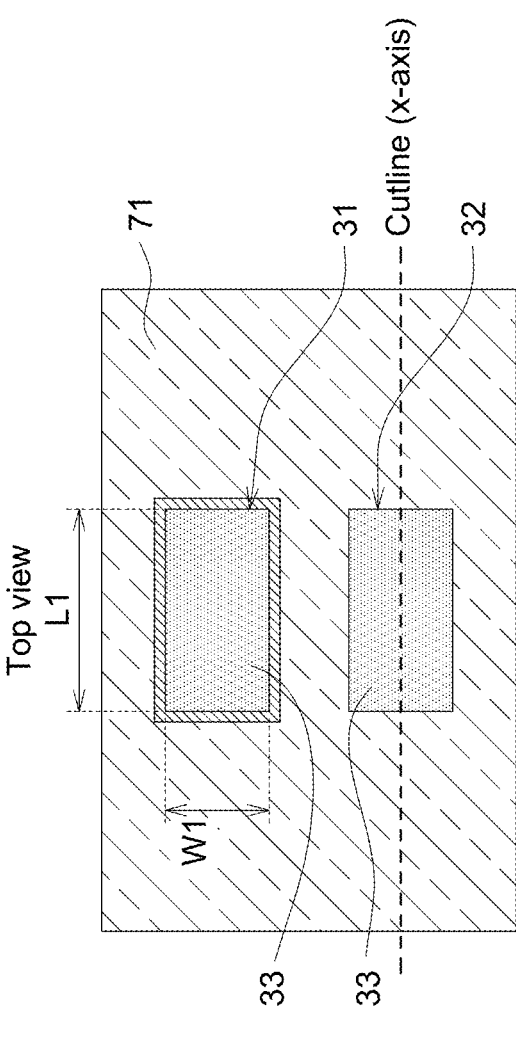
FIG. 7(b) is a diagram showing the NMOS active region without such Underground Insulating Layer.

Thereafter, refer to Step 310 and FIGS. 7(a)~7(b), remove the covering layer 36 to reveal the NMOS active regions 32, etch the nitride spacer 52, and then deposit a SOD (Spin on Dielectrics) layer or other dielectric layer (such as STI oxide layer) 71 all over the P Bulk substrate and CMP the dielectric layer 71, as shown in FIGS. 7(a) and 7(b). In other embodiment, both the nitride spacer 52 and the oxide spacer 51 are removed before the deposition of the SOD (Spin on Dielectrics) layer or other dielectric layer, and in another embodiment, when the PMOS active region 31 just includes a fin-shape PMOS transistor, such nitride spacer 52 and the oxide spacer 51 could be remained to prevent the fin-shape structure from collapse.

Wherein FIG. 7(a) shows the cross section view of the PMOS active region with the Underground Insulating Layer (SUIL) 53 therein, and FIG. 7(b) also shows the cross section view of the NMOS active region without such Underground Insulating Layer (SUIL) 53.

It is clear that the PMOS region body 54 of the PMOS active region 31 now is fully isolated from the P-type Bulk substrate 30 by the Underground Insulating Layer (SUIL) 53 and the SUIL is surrounded by another dielectric region (such as STI region or the dielectric layer 71), wherein the PMOS region body 54 is a LSOI (Localized Silicon On Insulator) structure. However, the NMOS active region 32 is still connected to the rest of the P-type Bulk substrate 30 (wherein the rest portion does not include the PMOS active region 31 and the NMOS active region 32, or the rest portion excludes the PMOS region body and the NMOS region body). Such NMOS active region 32 could be named as bulk NMOS region which includes NMOS region body, and the NMOS region body can be well used as a "substrate" to house NMOS transistors or other devices, wherein the NMOS region body is usually doped with P type dopants.

In one PMOS region body 54 or LSOI structure, it could include multiple planar or fin-shape transistors, so the area of the LSOI structure could be greater than that of one transistor, or greater than the sum of areas of those transistors. In another embodiment, one PMOS region body 54 or LSOI structure could only include one planar or fin-shape transistor, and in such case the area of the LSOI structure could be just the same or substantially the same as that of one transistor. Similarly, one NMOS region body could include multiple planar or fin-shape transistors, or only just include one planar or fin-shape transistor.

Some points are briefly described here: (1) Most of the state-of-the-art SOI (Silicon On Insulator) technology used in the present IC industry starts from a ready-made SOI wafer which has a thin layer of single-crystalline silicon material on top of an Oxide layer over an "entire" wafer acting as the start supporting substrate that has much higher cost than that of most prevailing ICs built up in a "Bulk" wafer substrate. The LSOI structure gives a lower cost solution and more degrees of freedom of making transistors based on the LSOI structure and making other transistors including ESD devices still in the Bulk substrate; (2) An effective processing method has been derived to locally and selectively create single-crystalline semiconductor island surrounded by dielectric or oxide layers on four sides and underneath the semiconductor island, that is, a LSOI structure can be formed.

Figure 7B:
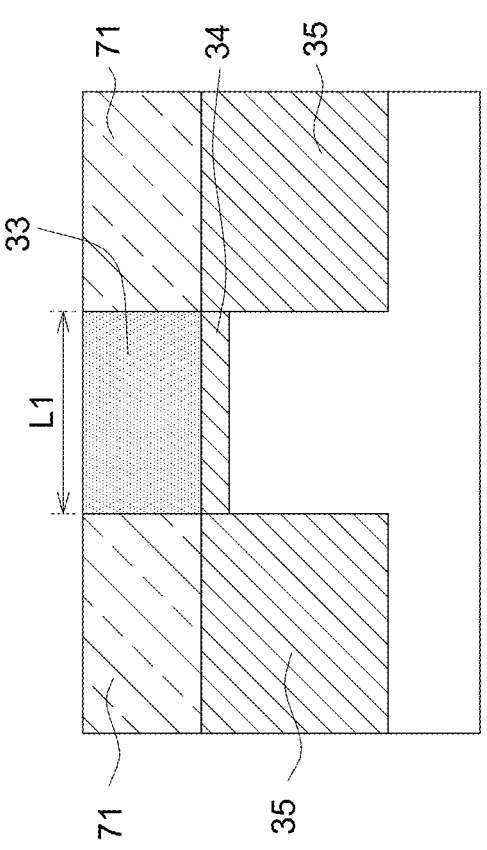
Figure 8A:
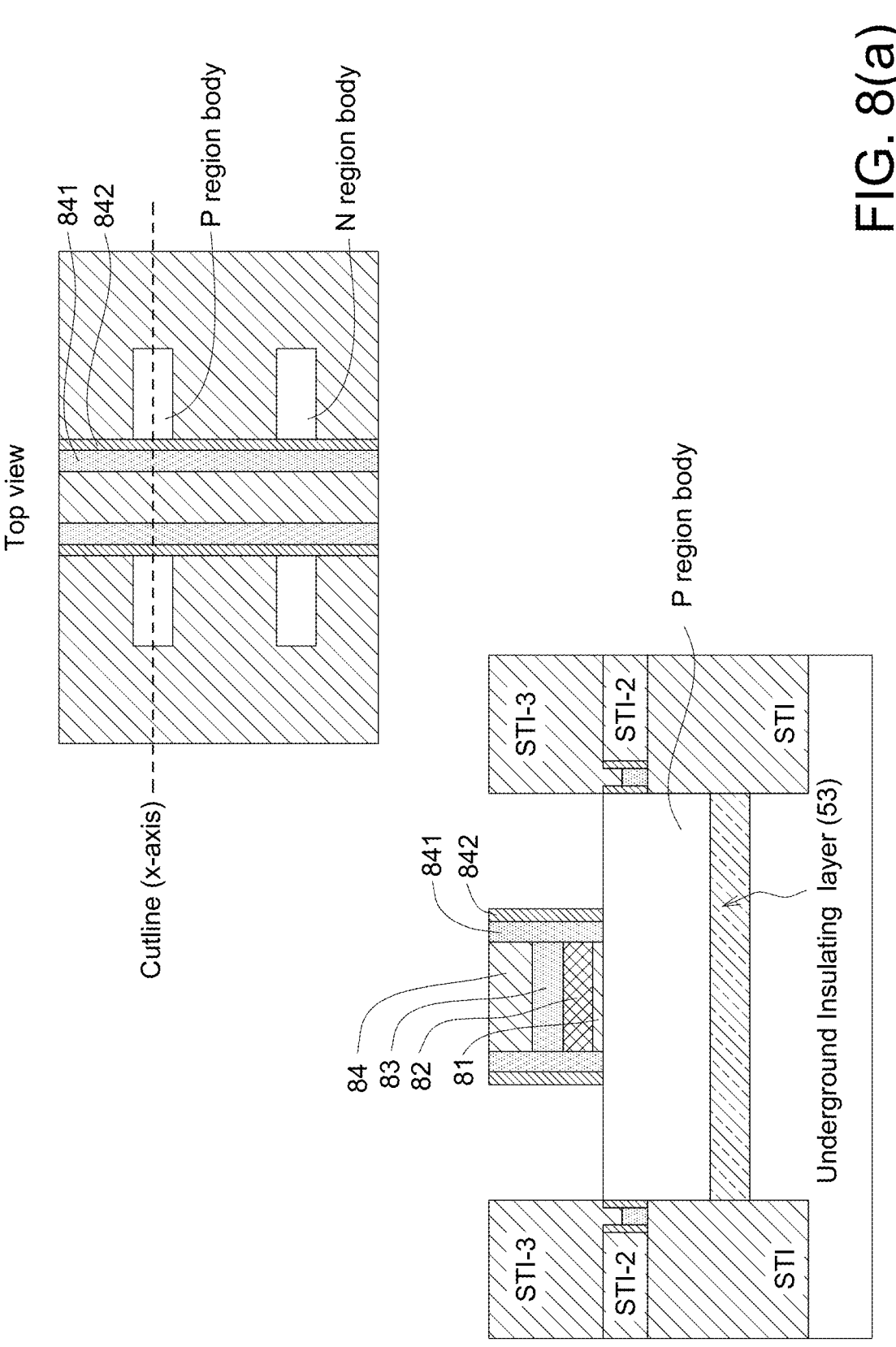
FIG. 8(a) is a diagram illustrating the processes to form gate structure of the PMOS transistor according to one embodiment of the present invention.
Figure 8B:
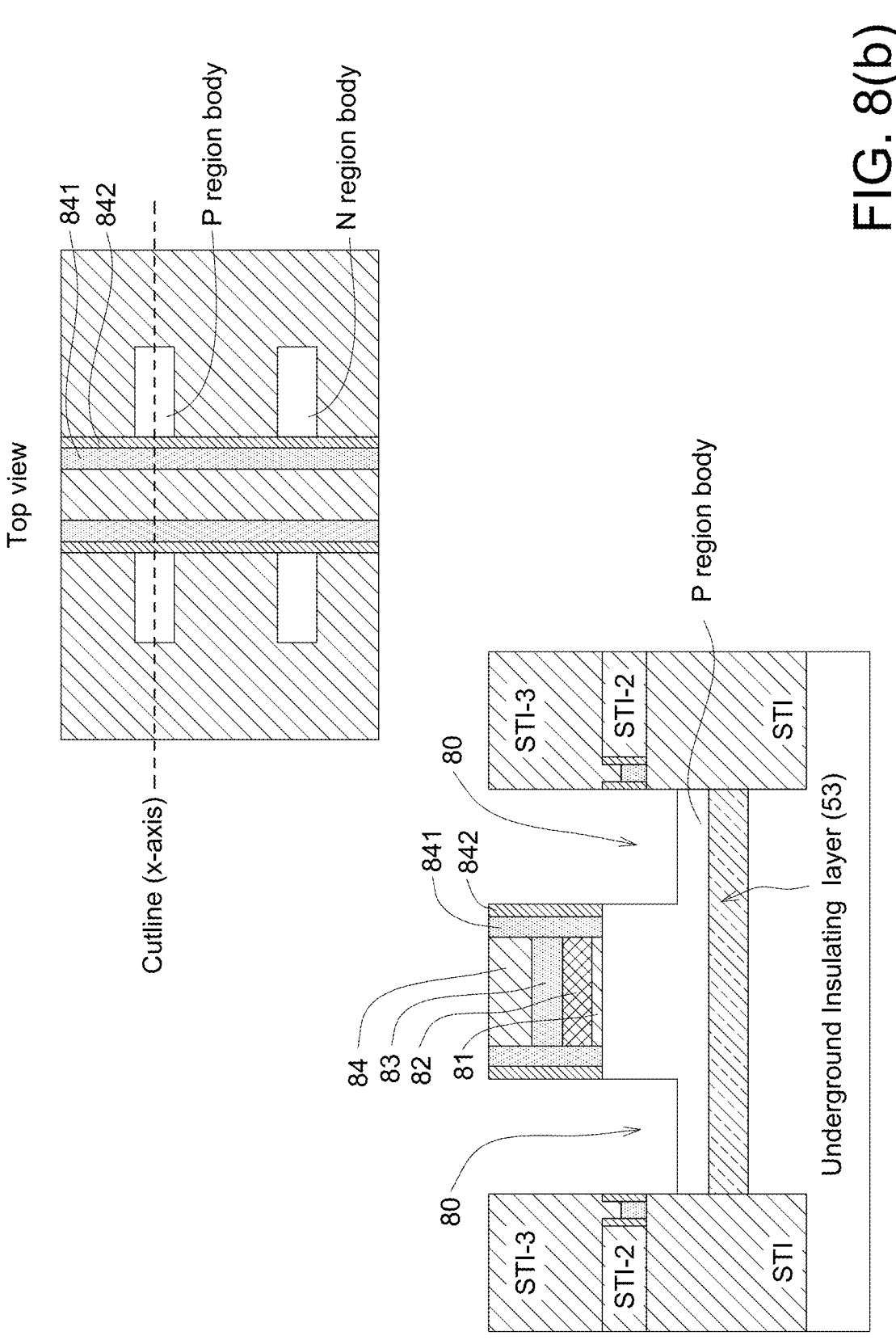
FIG. 8(b) is a diagram illustrating the process to form the shallow trenches in PMOS active region.
Figure 8C:
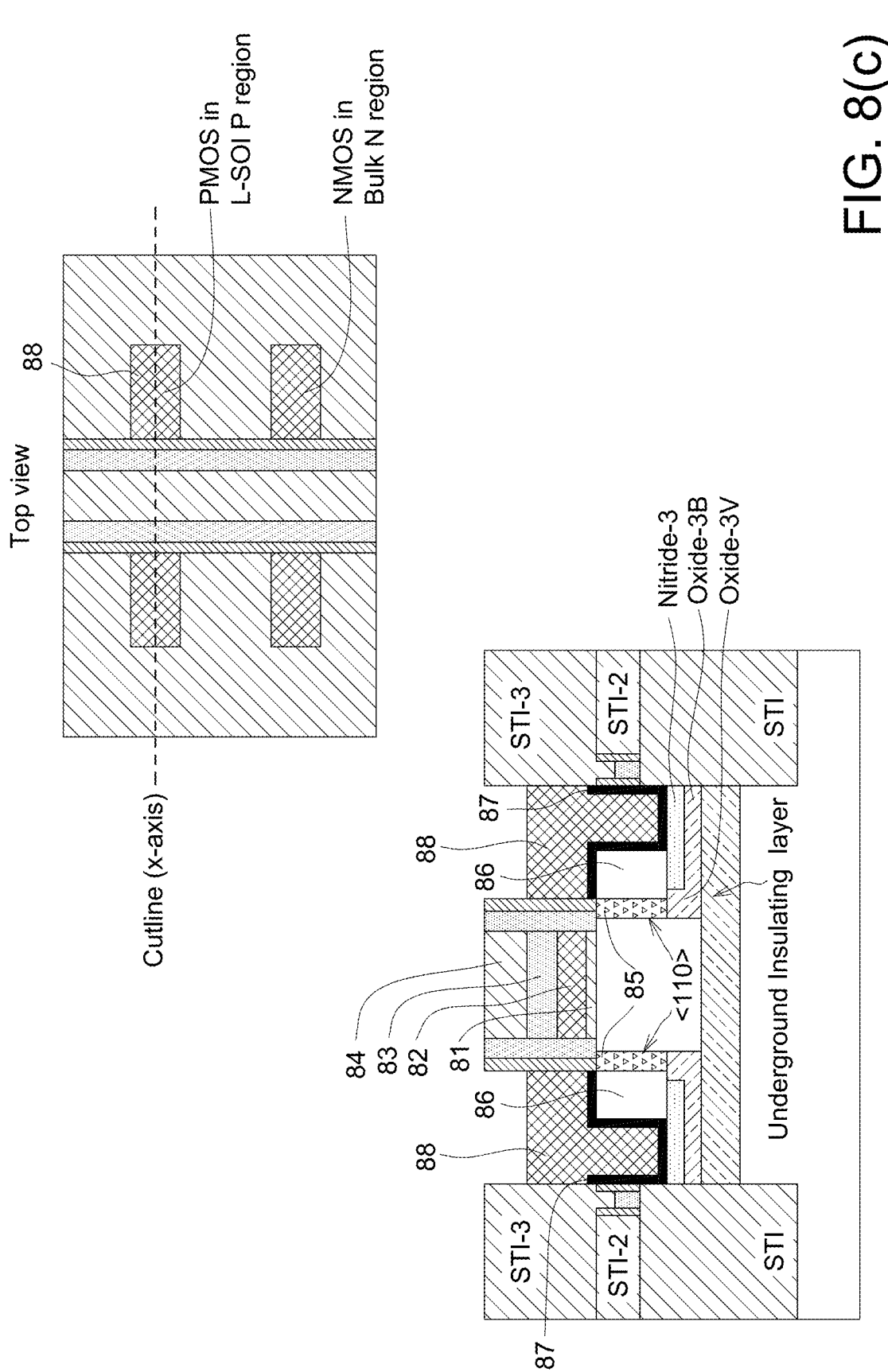
FIG. 8(c) is a diagram showing the PMOS transistor structure according to one embodiment of the present invention.
Figure 8D:
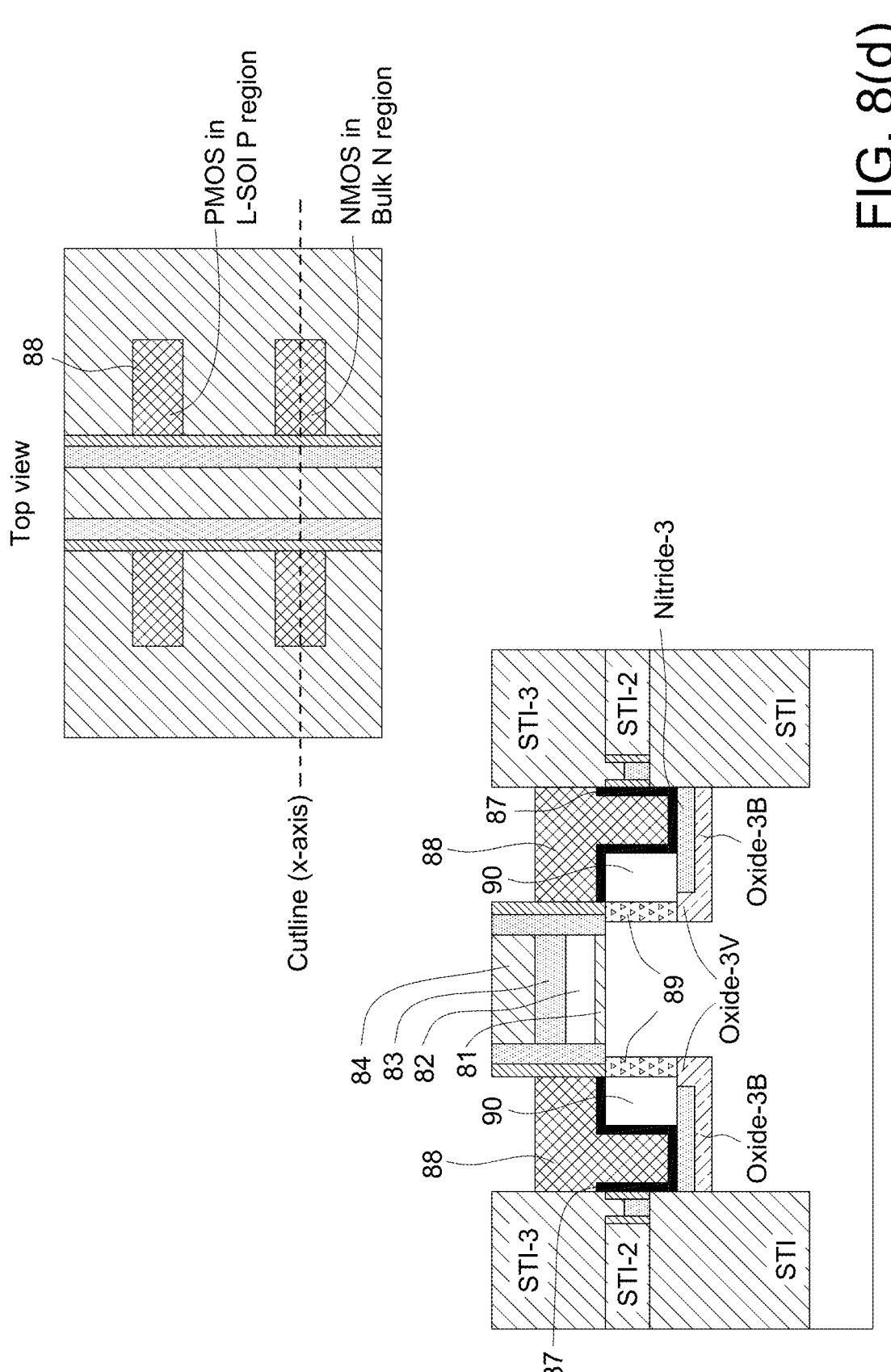
FIG. 8(d) is a diagram showing the NMOS transistor structure according to one embodiment of the present invention.

Based on the LSOI (Localized Silicon On Insulator) structure in FIGS. 7(*a*) and 7(*b*), the following describes the exemplary steps of making PMOS transistors based on the LSOI structure and making other NMOS transistors in the P type Bulk substrate 30 substrate. The PMOS transistors and the NMOS transistors could be planar or fin-shape transistors.

Refer to Step 402 and FIG. 8(*a*) regarding the formation of the gate structure, use a photolithographic technique to define the gate region which are no protected by the photoresist mask. Thereafter, by selective etching, remove the exposed pad-nitride layer 33 and then remove the exposed pad-oxide layer 34 to reveal the OSS of the P-type Bulk substrate 30. Thereafter, a Hi-K gate dielectric material 81 is formed in the defined Gate region, and a N+ polysilicon (or suitable metal material) as the gate conductive material 82 is deposited and then etched back. Thereafter, deposit nitride cap layer 83 and hard mask layer (or oxide cap layer) 84 over the gate conductive material 82. Thus, the gate structure includes the gate dielectric material 81, the gate conductive material 82, the nitride cap layer 83 and the oxide cap layer 84. The gate structure is formed within an etched region with a smooth line edge roughness, thus, the gate structure has smoother edge.

Afterward, remove the photoresist mask to expose the rest pad-nitride layer 33 and the rest pad-oxide layer 34. Etch the rest pad-nitride layer 33 and the rest pad oxide layer 34 to reveal the OSS of the P-type Bulk substrate 30. It is noticed that the top of the STI layer (such as STI-3 in FIG. 8(*a*)) is higher than the OSS, and such higher STI region could be helpful to limit the formation of source/drain regions by selective growth described later. Then form an oxide-2 spacer 841 and a nitride-2 spacer 842 on the edges of the gate structure, as shown in FIG. 8(*a*).

The following describes an example to form the source/drain regions. Refer to Step 404 and FIG. 8(*b*), based on the exposed OSS of the P-type Bulk substrate 30, etch away some silicon (about 80 nm deep) in the P-type Bulk substrate 30 to create shallow trenches 80, wherein the source/drain regions will be accommodated therein.

Then, refer to Step 406 and FIG. 8(*c*), use a thermal oxidation process, called as oxidation-3, to grow both Oxide-3V layers penetrating the vertical sidewalls of the shallow trenches 80 (assuming with a sharp crystalline orientation <110>) and Oxide-3B layers on top of the bottoms of the shallow trenches 80. The oxidation-3 process grows little oxide on these walls such that the width of the active source/drain regions is not really affected (FIG. 8(*c*)). Wherein the thickness of the Oxide-3V layer and Oxide-3B layer drawn in FIG. 8(*c*) and following figures are only shown for illustration purpose, and its geometry is not proportional to the dimension of the STI region shown in those figures. For example, the thickness of the Oxide-3V layer and Oxide-3B layer is around 10~20 nm, but the vertical height of the STI region could be around 150~200 nm. But it is very important to design this Oxidation-3 process such that the thickness of Oxide-3V be very accurately controlled under both precisely controlled thermal oxidation temperature, timing and growth rate. Since the thermal oxidation over a well-defined silicon surface should result in that 40% of the thickness of Oxide-3V taken away the thickness of the exposed <110>silicon surface in the vertical wall of the PMOS region body 54 and the remaining 60% of the thickness of Oxide-3V be counted as an addition outside the vertical wall of the PMOS region body 54. Therefore, the edge of the Oxide-3V could be well-controlled and be aligned (or substantially aligned) with the edge of the gate structure, such that the issue of over-lapping or under-lapping between the gate structure ad the LDD region could be improved.

Afterward, use CVD Nitride deposition and then etching back to form a Nitride-3 layer on the top of the Oxide-3B layer (FIG. 8(*c*)). (In another example, it is optional to further deposit Tungsten and etch back to form a Tungsten layer on the top of the CVD deposited the Nitride-3 layer. Then deposit TiN layer and etch back to form the TiN layer above the Tungsten layer, such that the top of the TiN layer is lower than OSS around 20~40 nm). The combination of the Nitride-3 layer, the Oxide-3V layer and Oxide-3B layer is the buried isolating layer. Then carry out an etching process to etch portion of the buried isolating layer, especially the Oxide-3V layer, to reveal the crystalline orientation <110> of the PMOS region body 54 (FIG. 8(*c*)).

Thereafter, refer to Step 408 and FIG. 8(*c*), use a selective growth technique (such as selective epitaxy growth) to form an P-type LDD (Lightly Doped Drain) regions 85 and then n+ doped regions 86, respectively from the revealed crystalline orientation <110> of the PMOS region body (FIG. 8(*c*)). To be mentioned, no ion-implantations for forming the drain and source regions are needed, and no high temperature and long thermal annealing is required to remove those damages due to heavy bombardments of forming these regions. Furthermore, since the top of the STI regions (including STI-3) is higher than the OSS, the selectively grown p-type LDD regions 85 and P+ doped regions 86 are limited by the higher STI regions without growing over the STI regions and have the well-grown <110>crystalline Silicon structure. Finally, deposit a TiN layer 87 and then a Tungsten plug 88 to fill in the trenches 80 (FIG. 8(*c*)). In one example, the height of the P+ doped regions 86 is around 40~50 nm, and the P+ doped regions are contacted by the TIN and Tungsten layers at least two sides (top side and one sidewall), so the contact resistance is dramatically reduced. The top surface of the Tungsten layer could be leveled to the top surface of STI region, such as the STI-3 shown in FIG. 8(*c*). It is clear that the PMOS transistor is formed in the LSOI (Localized Silicon On Insulator) region which could be named as "L-SOI PMOS region", and such PMOS transistor could be called as a fully isolated PMOS transistor.

Similarly, the NMOS transistors could be formed in the NMOS active regions 32 bases on the similar processes mentioned in Steps 402~408, as shown in FIG. 8(*d*). The major difference is that, in NMOS transistors, the selective growth technique (such as selective epitaxy growth) is used to form an N-type LDD (Lightly Doped Drain) regions 89 and then N+ doped regions 90, respectively from the revealed crystalline orientation <110> of the NMOS region body (FIG. 8(*d*)). It is clear that the semiconductor body of the NMOS transistor is still connected to the Bulk P sub-strate, and therefore is formed in the "Bulk NMOS region". Such NMOS transistor could be called as a bulk NMOS transistor.

Although in the previous embodiments, the gate structure is firstly formed before the formation of source/drain regions, it is well-known that the "Gate-Last" process can be performed in the present invention without difficulties and no needed to elaborate here.

Figure 9:
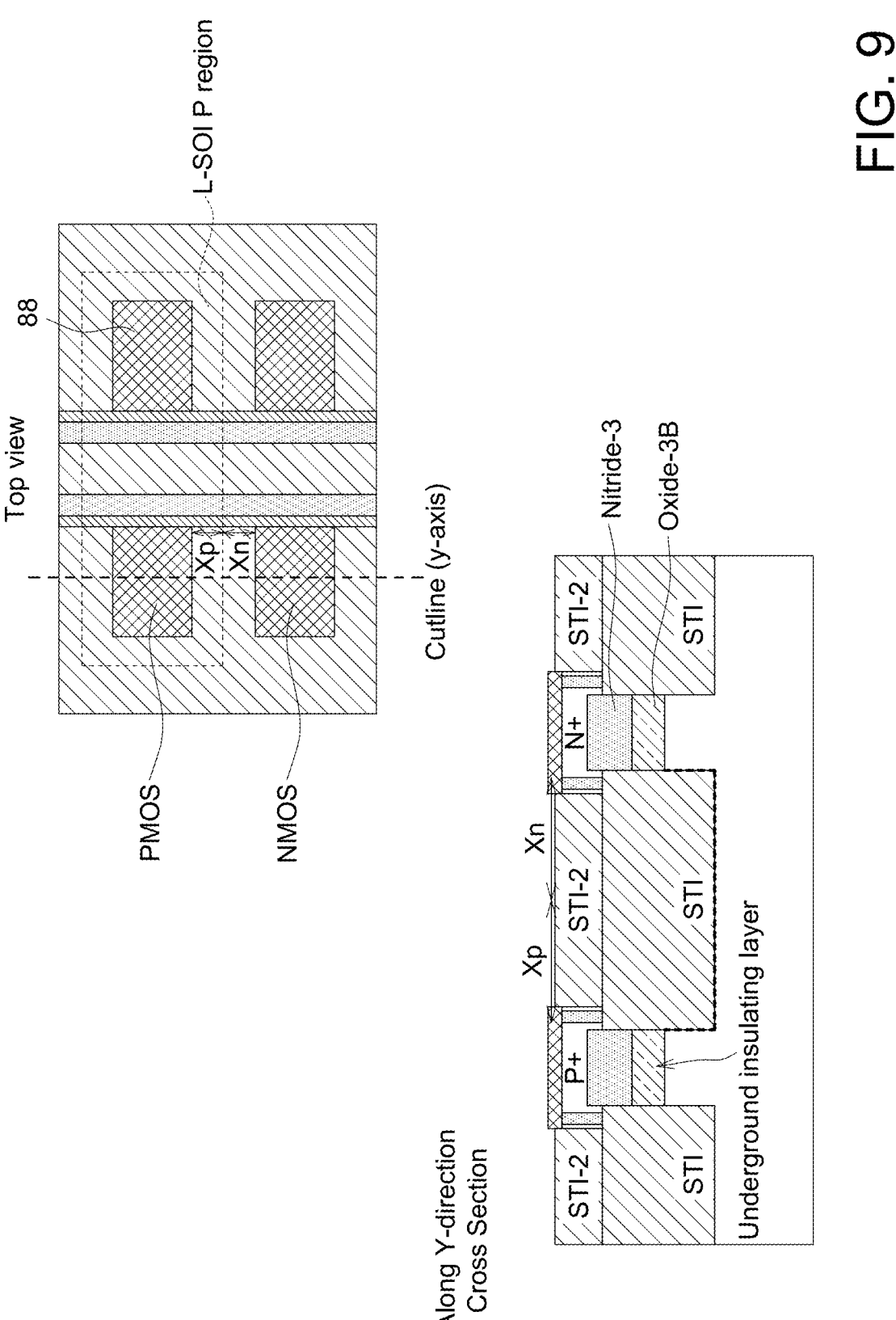
FIG. 9 illustrates the Y-direction cross section view of the fully isolated PMOS transistor and the bulk NMOS transistor according to one embodiment of the present invention.
Figure 10:
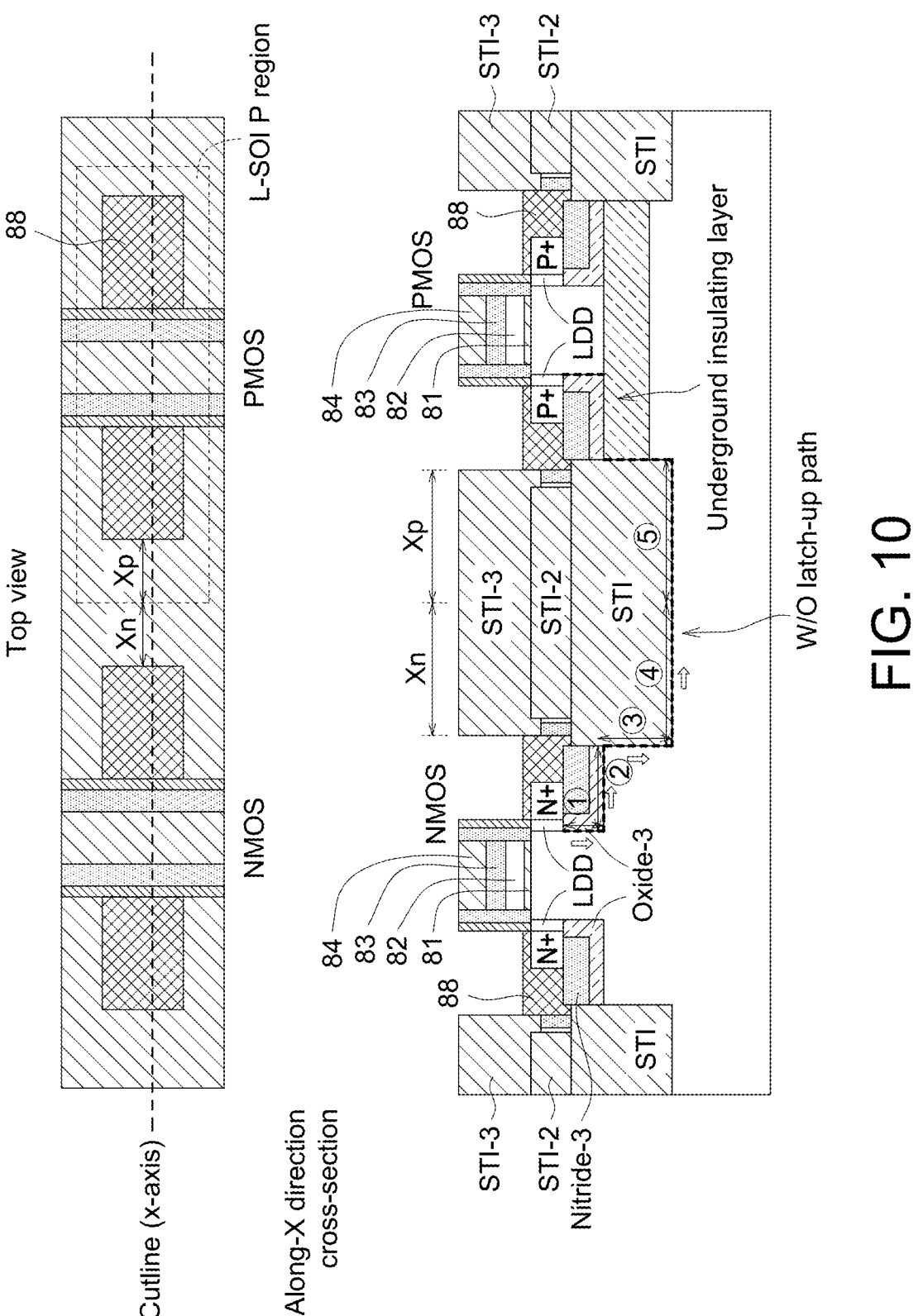
FIG. 10 illustrates the Y-direction cross section view of the fully isolated PMOS transistor and the bulk NMOS transistor according to another embodiment of the present invention.

As shown in FIG. 9 which illustrates the Y-direction cross section view of the combination of the fully isolated PMOS transistor in FIG. 8(*b*) and the bulk NMOS transistor FIG. 8(*c*), it is clear that the possible latch-up path is blocked by Nitride-3 and Oxide-3B (in the NMOS) and underground insulating layer under the PMOS transistor. In the event the fully isolated PMOS transistor in FIG. 8(*b*) and the bulk NMOS transistor FIG. 8(*c*) are arranged side-by-side as shown in FIG. 10, the possible latch-up path from the length ①, the length ②, the length ③, the length ④ and the length ⑤ is then blocked by the underground insulating layer under the PMOS transistor. Therefore, the reserved latch up distance (Xn+Xp) between the PMOS and NMOS transistors could be reduced, as compared with the conven-tional CMOS structure or SRAM structure.

Figure 11A:
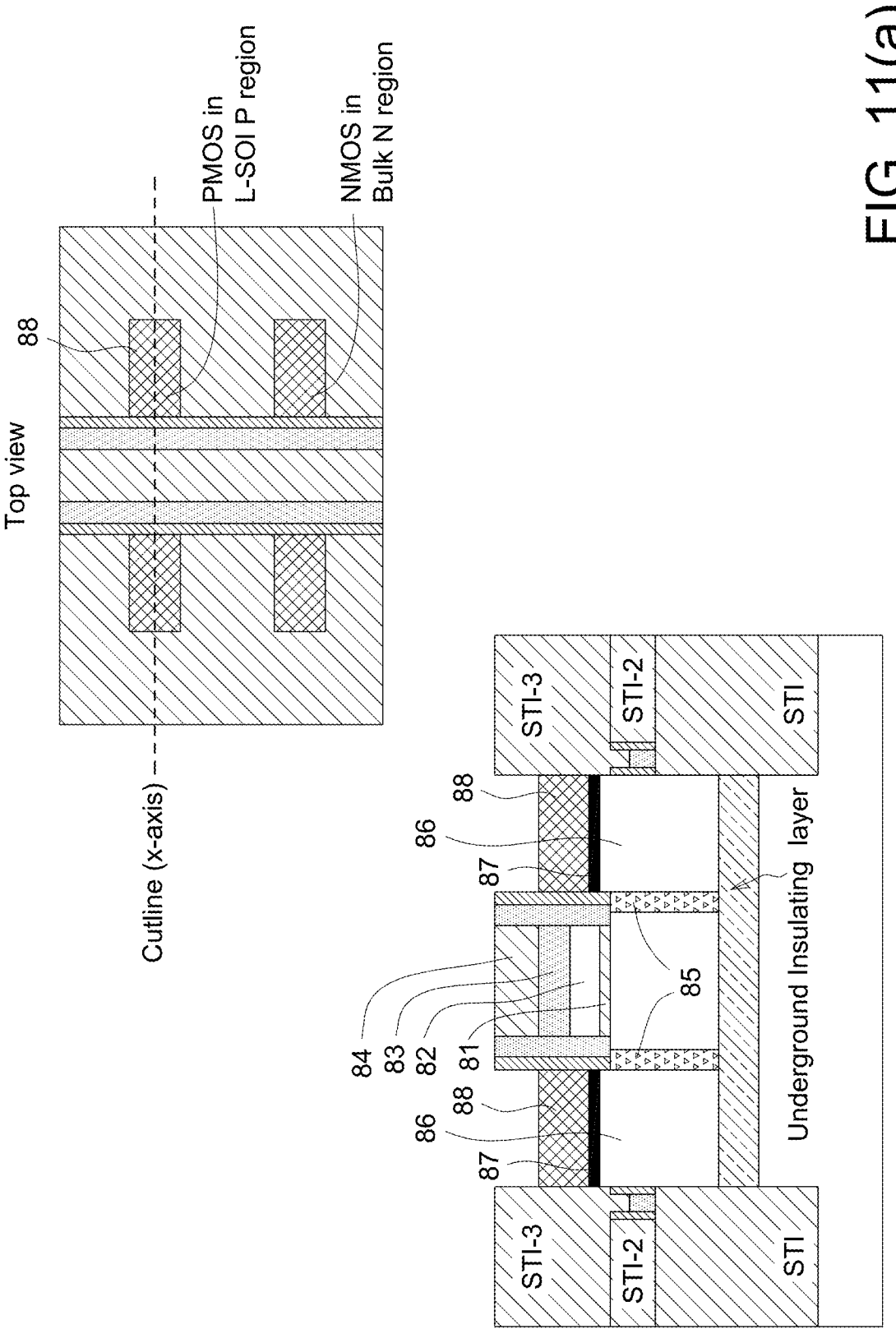
FIG. 11(a) is a diagram showing another PMOS transistor structure according to another embodiment of the present invention.
Figure 11B:
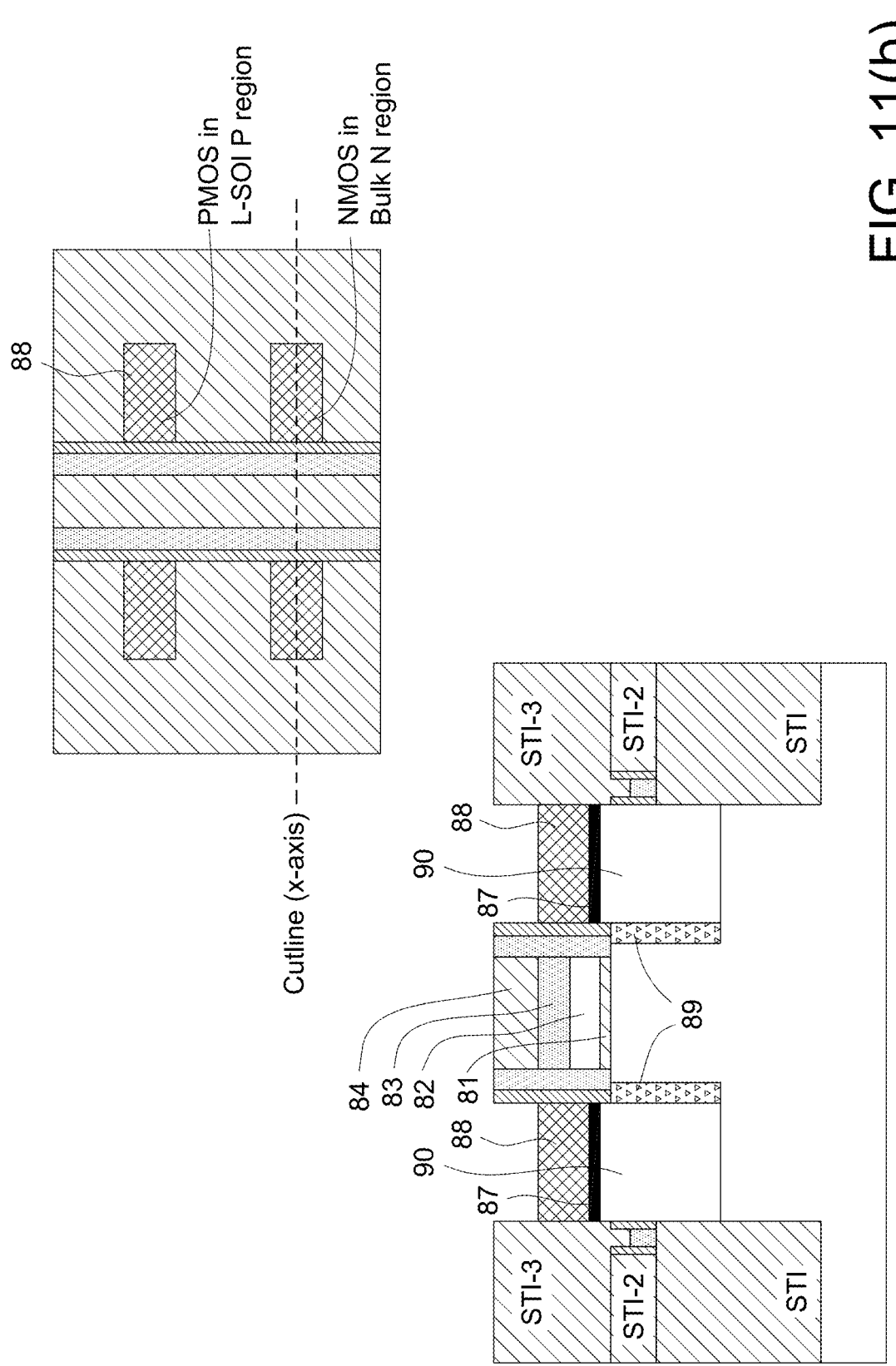
FIG. 11(b) is a diagram showing another NMOS transistor structure according to another embodiment of the present invention.

In another embodiment, the buried isolating layer (includ-ing the Nitride-3 layer, the Oxide-3V layer and Oxide-3B layer) could be omitted, as shown in FIG. 11(*a*) and FIG. 11(*b*), respectively. In this embodiment, the PMOS transistor is still fully insolated by the underground insulating layer, as shown in FIG. 11(*a*). Thus, the reserved latch up distance (Xn+Xp) between the PMOS and NMOS transistors in FIGS. 11(*a*) and 11(*b*) could be reduced, as compared with the conventional CMOS structure or SRAM structure. Of course, there are various examples to form PMOS transistors and NMOS transistors, such as depositing a doped layer and then thermally diffusing into the PMOS region body or NMOS region body. Those examples could be applied into the present invention as well. The PMOS transistors and NMOS transistors in the present invention could be either planar transistors or fin-structure transistors.

Figure 1:
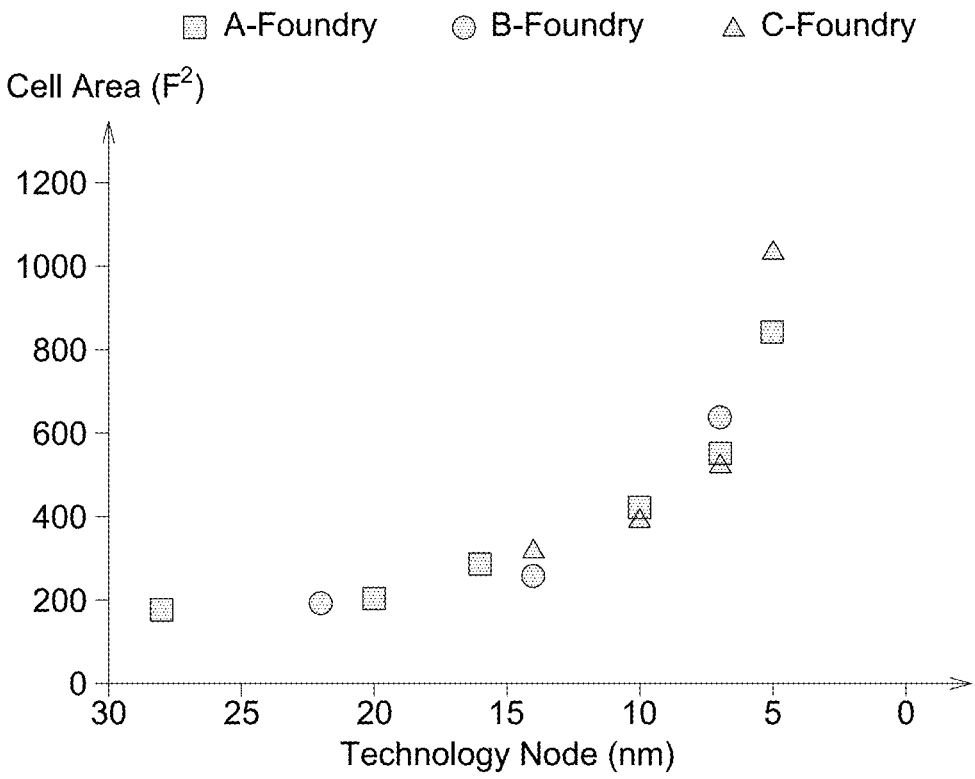
FIG. 1 is the currently available SRAM scaling curves from three foundries versus different process nodes.
Figure 2A:
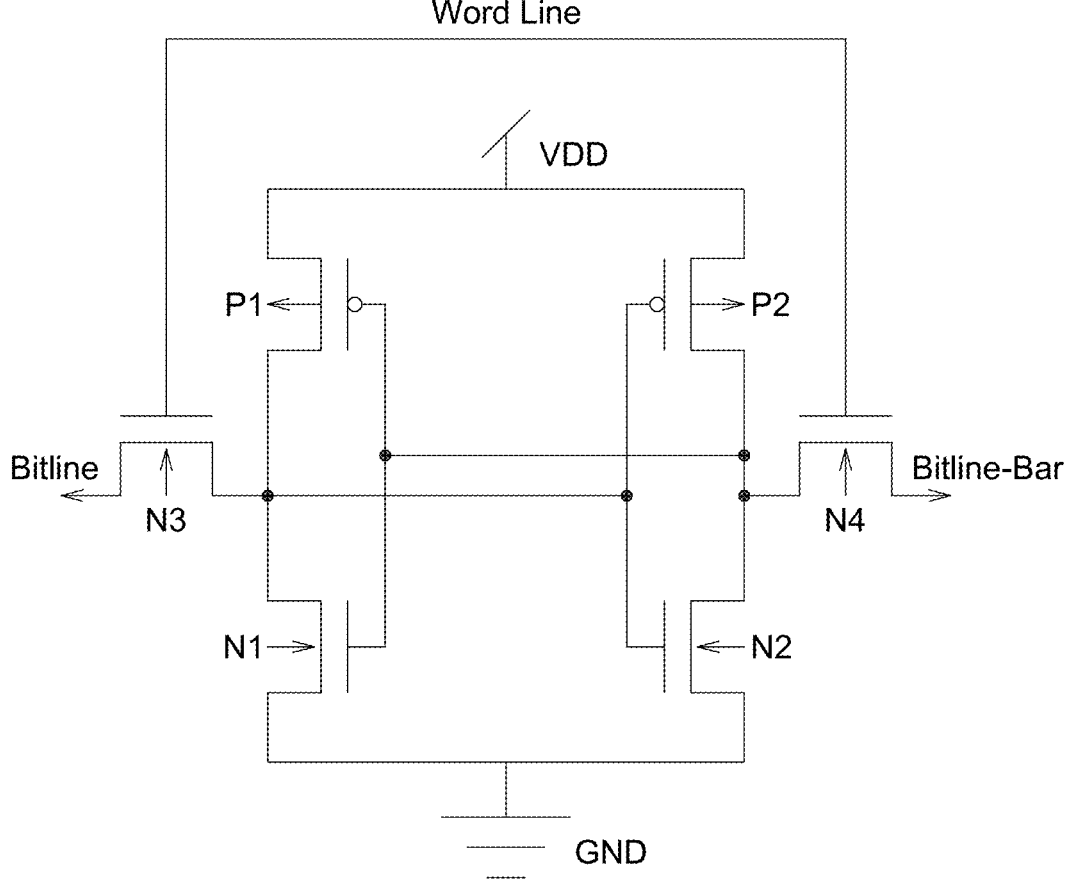
FIG. 2(a) is a circuit diagram illustrating a 6T SRAM structure.
Figure 2B:
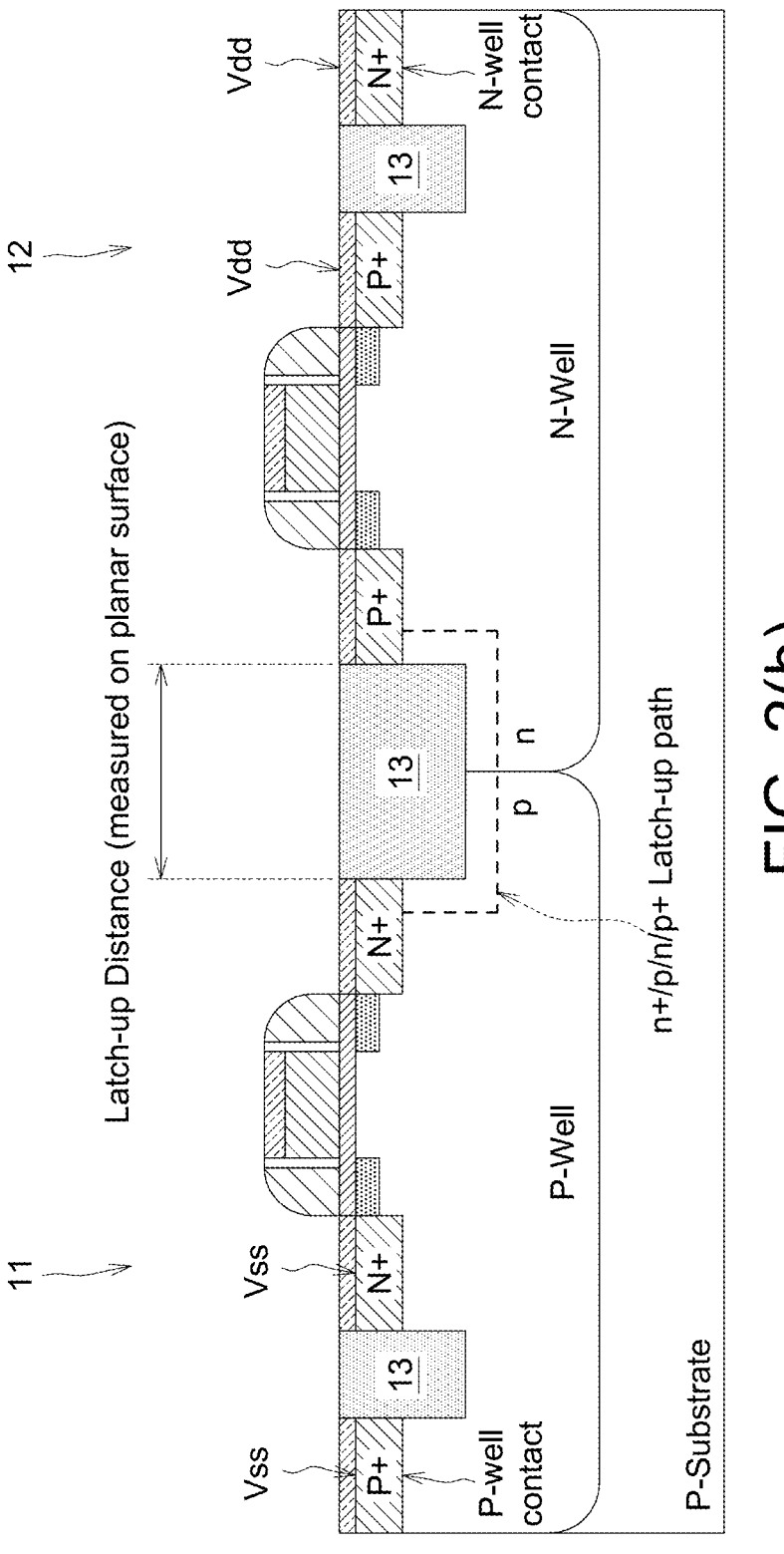
FIG. 2(b) illustrates the cross section view of a PMOS transistor and an NMOS transistor of the 6T SRAM structure located respectively inside some adjacent regions.
Figure 12:
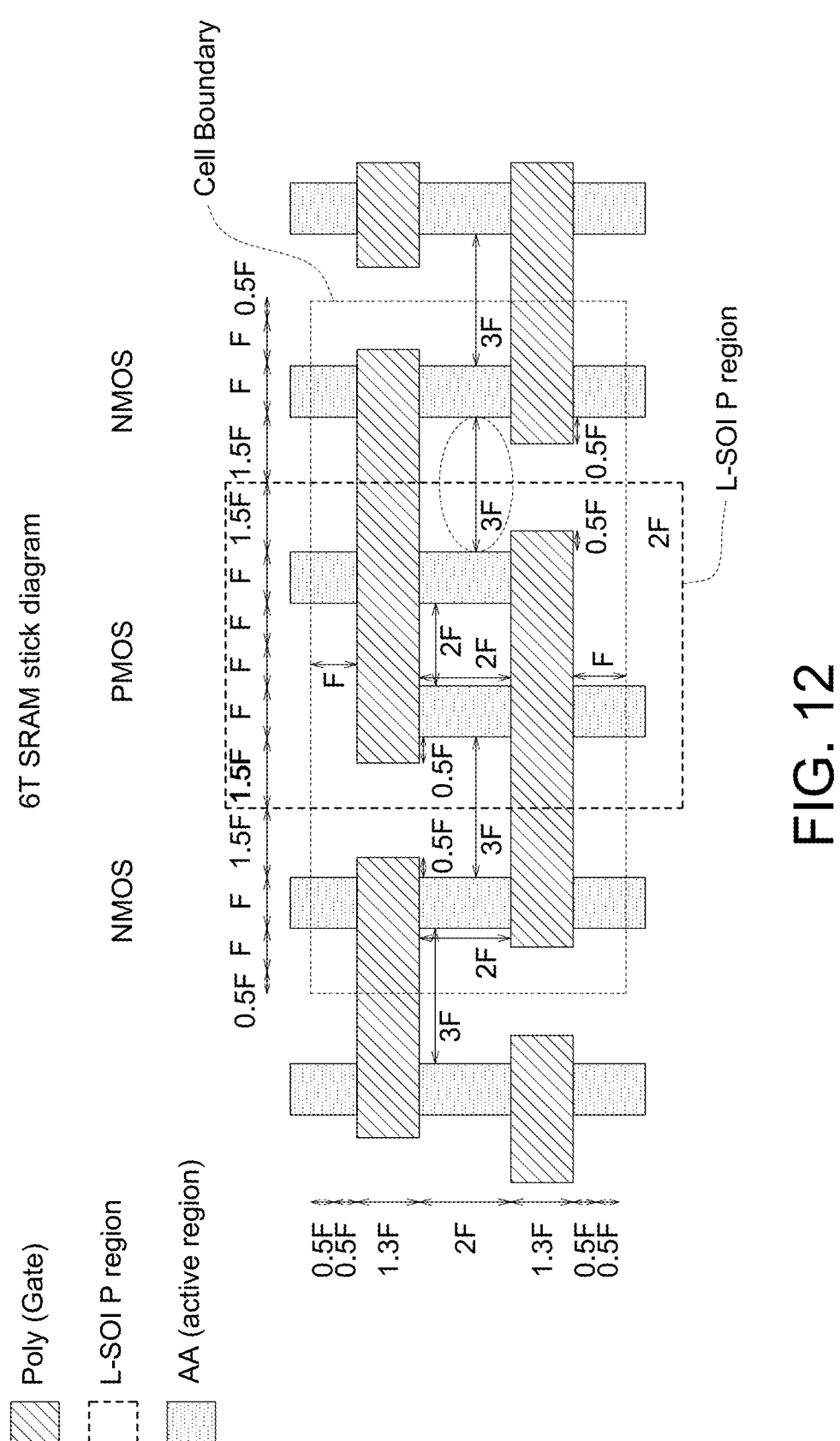
FIG. 12 is the stick diagram for a 6T SRAM according to the present invention.

Based on the aforesaid disclosure, a new SRAM structure is proposed as shown in FIG. 12 which illustrates the stick diagram for a 6T SRAM corresponding to schematic dia-gram in FIG. 2(*a*), wherein two PMOS transistors are formed in one (or more) L-SOI PMOS region, and the other four NMOS transistors are formed in one (or more) Bulk NMOS region. The reserved latch up distance between the PMOS and NMOS transistors could be as low as 3 F (marked in the dot ellipse). In this example, the gate length is 1.3 F, the width of the active region is 1 F, and the area of the SRAM is around 99 $F^2$. Of course, the present invention could be applied to any SRAM circuit (5T, 6T, 8T, 10T, etc.) or any CMOS circuit, and it is also possible that the PMOS transistors are located in Bulk PMOS region (that is, the semiconductor body of the PMOS transistor is con-nected to the Bulk substrate), but the NMOS transistors are located in the L-SOI NMOS region (that is, the semicon-ductor body of the NMOS transistor is fully isolated by the underground insulating layer).

Moreover, since there are underground insulating layers either under the PMOS transistors or the NMOS transistors of the proposed SRAM structure, the conventional N Well reserved for the PMOS transistors or the P Well reserved for the NMOS transistors (as shown in FIG. 2(*b*)) could be omitted, so are the conventional n+ well contacts which are originally used to connect the N Well to the high level voltage Vdd, and the p+ well contacts which are originally used to connect the P Well to the low level voltage VSS. Thus, the total area of the SRAM cell could be further decreased.

In summary, we can form LSOI (Localized Silicon On Insulator) islands started from the Bulk substrate without a need of buying an entire SOI wafer or SOI substrate which is very expensive. So between NMOS and PMOS transistors there is no need to reserve larger Latch-Up Distance for achieving a CMOS configuration. There is no path for current flow to cause awkward latch-up phenomena. As a result the SRAM cell size of the present invention can be made more compactly and the more simplified circuit layout can be accomplished with much less area.

Moreover, the conventional dual well regions or triple well regions (and the contacts thereof) could also be removed in the Bulk substrate. Thus, between a PMOS transistor and a NMOS transistor next to the PMOS tran-sistor, there is only one STI region between a P+ region of the PMOS transistor and a N+ region of the NMOS tran-sistor, wherein a lateral width of the one STI region is a minimum STI distance based on the design rule of the foundry. For example, the minimum STI distance is not greater than 3 F, wherein F is the minimum feature size or a process-node feature dimension.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broad-est interpretation so as to encompass all such modifications and similar arrangements and procedures.

What is claimed is:

1. A CMOS SRAM structure, comprising:
   a bulk semiconductor substrate with an original semicon-ductor surface, wherein the bulk semiconductor sub-strate comprises a PMOS region body and an NMOS region body;
   a set of PMOS transistors disposed in the PMOS region body;
   a set of NMOS transistors disposed in the NMOS region body and electrically connected to the set of PMOS transistors;
   a VDD contacting line electrically contacting to the set of PMOS transistors; and
   a VSS contacting line electrically contacting to the set of NMOS transistors;
   a word line electrically coupled to the set of NMOS transistors;
   a bit line electrically coupled to the set of NMOS tran-sistors; and
   a complementary bit line electrically coupled to the set of NMOS transistors;

wherein one of the PMOS region body and the NMOS region body is a localized semiconductor on insulator (SOI) region which is fully isolated from a rest portion of the bulk semiconductor substrate excluding the PMOS region body and the NMOS region body;

and the other one of the PMOS region body and the NMOS region body is not fully isolated from the rest portion of the bulk semiconductor substrate.

2. The CMOS SRAM structure in claim 1, wherein the localized SOI region is fully isolated from the rest portion of the bulk semiconductor substrate by an insulating layer and a shallow trench isolation (STI) region surrounding the localized SOI region, wherein the insulating layer is under the original semiconductor surface of the bulk semiconductor substrate.

3. The CMOS SRAM structure in claim 2, wherein a bottom of the STI region is lower than that of the insulating layer.

4. The CMOS SRAM structure in claim 2, wherein the shallow trench isolation (STI) region surrounds the insulating layer.

5. The CMOS SRAM structure in claim 2, wherein the PMOS region body is the localized SOI region, the insulating layer is positioned under the set of PMOS transistors, and the set of PMOS transistors are fully isolated from the rest portion of the bulk semiconductor substrate.

6. The CMOS SRAM structure in claim 5, wherein the insulating layer is an oxide layer extending from one sidewall to another opposite sidewall of the PMOS region body.

7. The CMOS SRAM structure in claim 1, wherein one NMOS transistor comprises:

a channel region;

a gate region above the channel region;

a source region electrically contacting to the channel region, wherein the source region includes a selectively grown LDD region and a selectively grown heavily doped region laterally extending from the selectively grown LDD region;

a metal region, wherein the metal region contacts a top surface and a sidewall of the source region; and a L-shape oxide layer under a bottom of the source region.

8. A CMOS SRAM structure, comprising:

a bulk semiconductor substrate with an original semiconductor surface, wherein the bulk semiconductor substrate comprises a first PMOS region body, a second PMOS region body, and an NMOS region body;

a first PMOS transistor disposed in the first PMOS region body, and a second PMOS transistor disposed in the second PMOS region body, wherein the first PMOS region body is physically separate from the second PMOS region body;

a set of NMOS transistors disposed in the NMOS region body and electrically connected to the first and the second PMOS transistors;

a VDD contacting line electrically contacting to the first and the second PMOS transistors; and a VSS contacting line electrically contacting to the set of NMOS transistors;

a word line electrically coupled to the set of NMOS transistors;

a bit line electrically coupled to the set of NMOS transistors; and a complementary bit line electrically coupled to the set of NMOS transistors;

wherein both the first PMOS region body and the second PMOS region body are fully isolated from a rest portion of the bulk semiconductor substrate excluding the first PMOS region body, the second PMOS region body, and the NMOS region body; and the NMOS region body is not isolated from the rest portion of the bulk semiconductor substrate.

9. The CMOS SRAM structure in claim 8, wherein the first PMOS region body is fully isolated from the rest portion of the bulk semiconductor substrate by a first insulating layer and a first shallow trench isolation (STI) region surrounding the first PMOS region body, wherein the first insulating layer is under the original semiconductor surface of the bulk semiconductor substrate.

10. The CMOS SRAM structure in claim 9, wherein the second PMOS region body is fully isolated from the rest portion of the bulk semiconductor substrate by a second insulating layer and a second shallow trench isolation (STI) region surrounding the second PMOS region body, wherein the second insulating layer is under the original semiconductor surface of the bulk semiconductor substrate; wherein the second insulating layer is physically separate from the first insulating layer.

11. The CMOS SRAM structure in claim 8, wherein each of the first PMOS transistor and the second PMOS transistor is a fin-shape transistor.

12. The CMOS SRAM structure in claim 11, wherein an area of the first PMOS transistor is the same or substantially the same as that of the first PMOS region body, and an area of the second PMOS transistor is the same or substantially the same as that of the second PMOS region body.

13. The CMOS SRAM structure in claim 8, wherein the NMOS region body is electrically coupled to the rest portion of the bulk semiconductor substrate.

14. The CMOS SRAM structure in claim 8, wherein the CMOS SRAM structure is a 6T SRAM structure including the first PMOS transistor, the second PMOS transistor, and the set of NMOS transistors which comprises four NMOS transistors.

15. A CMOS SRAM structure, comprising:

a bulk semiconductor substrate with an original semiconductor surface;

a plurality of transistors formed based on the bulk semiconductor substrate, wherein the plurality of transistors includes a set of first type transistors and a set of second type transistors, and the set of first type transistors are electrically coupled to the set of second type transistors;

a plurality of conductive contacts coupled to the plurality of transistors;

wherein one first type transistor is formed based on a first semiconductor region of the bulk semiconductor substrate, and one second type transistor is formed based on a second semiconductor region of the bulk semiconductor substrate; the one first type transistor and the one second type transistor form a CMOS configuration;

wherein the first semiconductor region is fully isolated from a rest portion of the bulk semiconductor substrate not including the first semiconductor region and the second semiconductor region, and the second semiconductor region is not fully isolated from and is electrically connected to the rest portion of the bulk semiconductor substrate.

16. The CMOS SRAM structure according to claim 15, further comprising:

an underground insulating layer under the original semiconductor surface of the bulk semiconductor substrate and formed under the one first type transistor; and a shallow trench isolation region surrounding the one first type transistor;

wherein the one first type transistor is fully isolated from the rest portion of the bulk semiconductor substrate by the underground insulating layer and the shallow trench isolation region.

17. The CMOS SRAM structure according to claim 16, wherein the shallow trench isolation region surrounds the underground insulating layer.

18. The CMOS SRAM structure according to claim 16, wherein the one first type transistor is a PMOS transistor, and the one second type transistor is an NMOS transistor, and the bulk semiconductor substrate is a bulk silicon substrate.

19. The CMOS SRAM structure according to claim 18, wherein the underground insulating layer comprises oxide.

20. The CMOS SRAM structure according to claim 18, wherein the first semiconductor region is a PMOS region body, an area of the one first type transistor is less than that of the PMOS region body.

21. The CMOS SRAM structure according to claim 18, wherein the first semiconductor region is a PMOS region body, an area of the one first type transistor is the same or substantially the same as that of the PMOS region body.

22. A CMOS SRAM circuit, comprising:

a bulk semiconductor substrate with a PMOS region body and an NMOS region body, wherein the bulk semiconductor substrate is not a SOI substrate;

a set of PMOS transistors formed in the PMOS region body; and a set of NMOS transistors formed in the NMOS region body;

one of the set of PMOS transistors and one of the set of NMOS transistors form a CMOS configuration;

wherein one of the PMOS region body and the NMOS region body is encompassed by a well region which is not fully isolated from the bulk semiconductor substrate; and the other one of the PMOS region body and the NMOS region body is encompassed by another well region which is fully isolated from the bulk semiconductor substrate; wherein the well region and the another well region are separated from each other.

23. The CMOS SRAM circuit in claim 22, wherein the well region is an N well region, and the PMOS region body is not encompassed by the N well region in the bulk semiconductor substrate.

24. The CMOS SRAM circuit in claim 22, wherein the well region is a P well region, and the NMOS region body is not encompassed by the P well region in the bulk semiconductor substrate.

25. The CMOS SRAM circuit in claim 22, wherein there is only one STI region between a P+ region of one PMOS transistor of the set of PMOS transistors and a N+ region of one NMOS transistor of the set of NMOS transistors, wherein a lateral width of the one STI region is a minimum STI distance.

26. The CMOS SRAM circuit in claim 25, wherein the minimum STI distance is not greater than 3F, wherein F is the minimum feature size or a process-node feature dimension.

*    *    *    *    *